(12) United States Patent
Chern et al.

(10) Patent No.: US 10,083,856 B2
(45) Date of Patent: Sep. 25, 2018

(54) ISOLATION REGIONS FOR SEMICONDUCTOR STRUCTURES AND METHODS OF FORMING THE SAME

(71) Applicant: Taiwan Semiconductor Manufacturing Company Limited, Hsinchu (TW)

(72) Inventors: Chan-Hong Chern, Palo Alto, CA (US); Chun-Lin Tsai, Hsinchu (TW); Mark Chen, Hsinchu County (TW); King-Yuen Wong, Tuen Mun (HK)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/224,778

(22) Filed: Aug. 1, 2016

(65) Prior Publication Data
US 2018/0033682 A1  Feb. 1, 2018

(51) Int. Cl.
| | | |
|---|---|---|
| *H01L 21/00* | (2006.01) | |
| *H01L 27/00* | (2006.01) | |
| *H01L 21/762* | (2006.01) | |
| *H01L 29/20* | (2006.01) | |
| *H01L 29/205* | (2006.01) | |
| *H01L 29/778* | (2006.01) | |
| *H01L 29/06* | (2006.01) | |

(Continued)

(52) U.S. Cl.
CPC .... *H01L 21/76283* (2013.01); *H01L 21/8252* (2013.01); *H01L 27/0605* (2013.01); *H01L 29/0649* (2013.01); *H01L 29/2003* (2013.01); *H01L 29/205* (2013.01); *H01L 29/66462* (2013.01); *H01L 29/7787* (2013.01)

(58) Field of Classification Search
CPC ............. H01L 21/762; H01L 21/76283; H01L 21/8252; H01L 27/0605; H01L 27/2003; H01L 29/0649; H01L 29/205; H01L 29/66462; H01L 29/7787
See application file for complete search history.

(56) References Cited

U.S. PATENT DOCUMENTS

| | | | | |
|---|---|---|---|---|
| 4,502,913 A | * | 3/1985 | Lechaton | H01L 21/3065 204/192.32 |
| 4,685,198 A | * | 8/1987 | Kawakita | H01L 21/762 148/DIG. 115 |

(Continued)

*Primary Examiner* — Dale E Page
*Assistant Examiner* — Quovaunda V Jefferson
(74) *Attorney, Agent, or Firm* — Jones Day

(57) ABSTRACT

Semiconductor structures including isolation regions and methods of forming the same are provided. A first layer is formed over a substrate, where the first layer comprises a semiconductor material. First and second trenches are etched, with each of the first and second trenches extending through the first layer and into the substrate. A wet etchant is introduced into the trenches, and the wet etchant etches a first opening below the first trench and a second opening below the second trench. Each of the first and second openings extends laterally below the first layer. The first and second openings are separated by a portion of the substrate adjoining the first and second openings. An oxidation process is performed to oxidize the portion of the substrate adjoining the first and second openings. An insulating material is deposited that fills the openings and the trenches.

20 Claims, 25 Drawing Sheets

(51) Int. Cl.
*H01L 27/06* (2006.01)
*H01L 29/66* (2006.01)
*H01L 21/8252* (2006.01)

(56) References Cited

U.S. PATENT DOCUMENTS

| | | | | |
|---|---|---|---|---|
| 4,888,300 A | * | 12/1989 | Burton | H01L 21/30604 |
| | | | | 148/DIG. 116 |
| 6,380,065 B1 | * | 4/2002 | Komai | H01L 21/76843 |
| | | | | 257/E21.585 |
| 7,361,946 B2 | * | 4/2008 | Johnson | G01N 27/129 |
| | | | | 257/253 |
| 2012/0153300 A1 | * | 6/2012 | Lidow | H01L 21/743 |
| | | | | 257/77 |
| 2012/0156836 A1 | * | 6/2012 | Shealy | H01L 21/02145 |
| | | | | 438/172 |

* cited by examiner

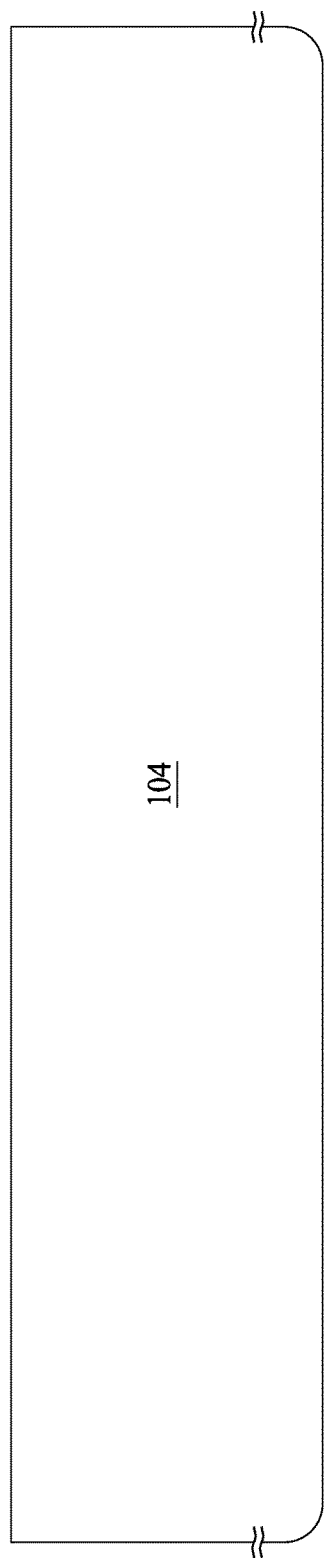

ISOLATION REGIONS FOR SEMICONDUCTOR STRUCTURES AND METHODS OF FORMING THE SAME

BACKGROUND

As the integration density of semiconductor integrated circuits increases, circuit components, such as transistors, are being formed closer to each other. The formation of circuit components in close vicinity to each other can result in various negative consequences, such as unwanted electrical coupling between the components via a common substrate. This unwanted electrical coupling can cause the components to malfunction and/or exhibit degraded performance. To address this issue, techniques for electrically isolating the components are employed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
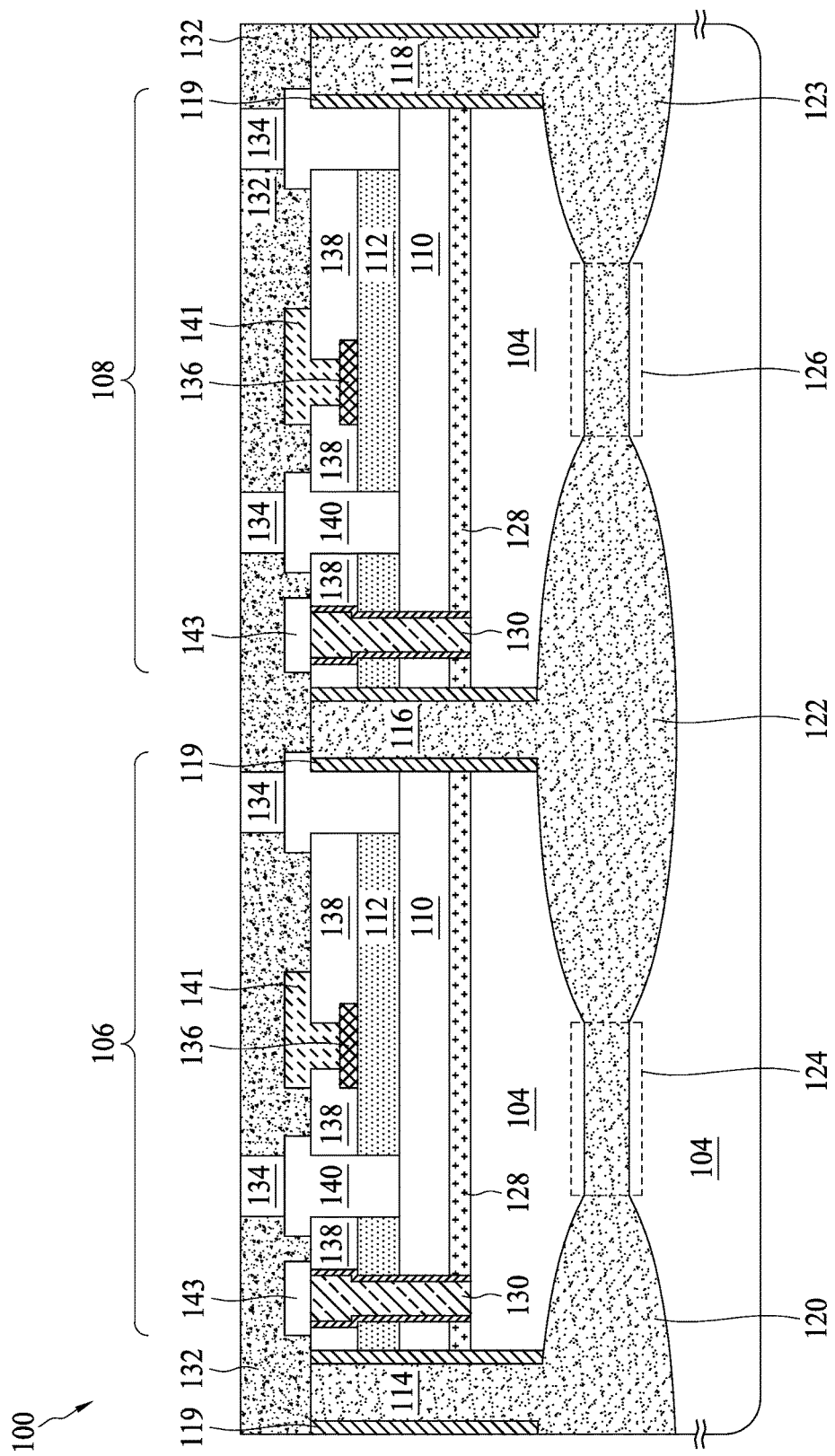
FIG. 1 depicts a semiconductor structure including transistors that are electrically isolated from each other using an isolation region, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

When multiple circuit components (e.g., transistors, etc.) are formed on a common substrate, unwanted electrical coupling can occur between the components. In examples, the coupling occurs via the common substrate. To eliminate or mitigate such coupling issues, the instant disclosure provides isolation regions for semiconductor structures and methods for forming isolation regions. The isolation regions provide physical separation between components formed on a common substrate and comprise insulating materials to eliminate or decrease unwanted electrical coupling between the components.

The isolation regions and methods disclosed herein are usable in a variety of different semiconductor structures. For instance, the isolation structures and methods of the instant disclosure are used to provide electrical isolation between multiple gallium nitride (GaN) transistors formed on a common silicon substrate, in examples. When multiple GaN transistors are formed on a common substrate, unwanted electrical coupling can occur between the transistors via the substrate. Such electrical coupling is especially problematic when different body biases are applied to the GaN transistors and/or when the GaN transistors are operated in different power domains. This electrical coupling can degrade performance of the GaN transistors or result in circuit malfunctioning, among other issues. The approaches of the instant disclosure mitigate or eliminate such issues by providing structures that isolate respective GaN transistors, thus preventing unwanted electrical coupling between the transistors.

FIG. 1 depicts a semiconductor structure 100 including transistors 106, 108 that are electrically isolated from each other using an isolation region, in accordance with some embodiments. In this figure, transistors 106, 108 comprise GaN transistors (e.g., GaN HEMTs) formed on a silicon substrate 104. To form the transistors 106, 108, a number of layers are formed over the silicon substrate 104 using an epitaxial process. The layers include a GaN layer 110, which is formed over an optional transition layer 128 or directly on the silicon substrate 104. In examples, the GaN layer 110 comprises a channel layer for the GaN transistors 106, 108 or a portion of such a channel layer. The transition layer 128 includes a nucleation layer of aluminum nitride (AlN) and/or a buffer layer comprising a different material, in examples.

The example of FIG. 1 shows an aluminum gallium nitride (AlGaN) layer 112 formed on top of the GaN layer 110. The AlGaN layer 112 comprises an active layer (e.g., donor-supply layer), in examples, and an interface exists between the GaN layer 110 and the AlGaN layer 112. In examples, a carrier channel of two-dimensional electron gas (2-DEG) is located at the interface between the layers 110, 112. In other examples, the AlGaN layer 112 is replaced with a layer comprising another material, such as AlGaAs or AlInP, for instance.

Source and drain features 140 for the respective transistors 106, 108 are configured to electrically connect to the GaN layer 110, the AlGaN layer 112, and/or the carrier channel located at the interface between the layers 110, 112. Each of the source and drain features 140 comprises a metallic material or metal alloy, in examples. The metallic material or metal alloy is embedded in the AlGaN layer 112 and may be further embedded in a top portion of the GaN layer 110. In examples, the metallic material or metal alloy comprises Al, Ti, Cu, AlN, TiN, Al3Ti, or AlTiN, for instance.

Each of the GaN transistors 106, 108 further includes a gate structure 141 that is disposed on a polarization modulation layer 136 and between the source and drain features 140. The gate 141 includes a conductive material which functions as a gate electrode for receiving a bias voltage. In various examples, the conductive material includes a refractory metal or its compounds (e.g., tungsten (W), titanium nitride (TiN), tantalum (Ta), etc.). Other commonly used metals for the gate 141 include nickel (Ni) and gold (Au), for instance. The gate structure 141 may include one layer or multiple layers of different materials. The polarization modulation layer 136, if used, modulates the dipole concentration in the AlGaN layer as result in changing the 2-DEG concentration in the AlGaN/GaN interface channel. Thus, a depletion mode (normally on) AlGaN/GaN HEMT can be made to be a normally-off enhancement mode AlGaN/GaN HEMT.

In the example of FIG. 1, a passivation material 138 is formed over the AlGaN layer 112. The passivation material 138 provides electrical stability by isolating the transistor surface (e.g., portions of the AlGaN layer 112 in the example of FIG. 1) from electrical and chemical conditions in the environment. The passivation material 138 thus reduces reverse-current leakage, increases breakdown voltage, and raises a power dissipation rating of the transistors 106, 108, in examples. The passivation material 138 may be silicon oxide, silicon nitride, silicon oxynitride, carbon doped silicon oxide, carbon doped silicon nitride, carbon doped silicon oxynitride, zinc oxide, zirconium oxide, hafnium oxide, titanium oxide, or another suitable material. A dielectric material 132 (labeled "inter-layer dielectric" or "ILD" in the example of FIG. 1) is formed over the passivation material 138, the source and drain features 140, and the gate structure 141. Metallic contacts 134 are deposited over the source and drain features 140.

A through-GaN via 130 (labeled "TGV" in FIG. 1) electrically connects a body bias feature 143 to the silicon substrate 104. Like the source and drain features 140, the body bias feature 143 comprises a metallic material or metal alloy (e.g., Al, Ti, Cu, AlN, TiN, Al3Ti, AlTiN, etc.), in examples. The through-GaN via 130 extends from the body bias features 143, through the layers 110, 112, 128, 138, and into the silicon substrate 104, as shown in the figure. To electrically connect the body bias feature 143 to the silicon substrate 104, the through-GaN via 130 comprises a conductive material, in examples. The through-GaN via 130 further comprises an insulating material that covers sidewalls of the via.

Using the body bias feature 143 and the through-GaN via 130, a voltage can be applied to the silicon substrate 104 (or a portion of the silicon substrate 104). In examples, different body bias voltages are applied to each of the transistors 106, 108, and/or the transistors 106, 108 are operated in different power domains. For instance, the transistor 106 may receive a relatively low body bias voltage and operate in a relatively low power domain, while the transistor 108 may receive a relatively high body bias voltage and operate in a relatively high power domain. When the transistors 106, 108 are operated at different body bias voltages and/or in different power domains, electrical coupling between the transistors 106, 108 can cause performance degradation or circuit malfunctioning. In examples, the coupling occurs via the common silicon substrate 104.

Under the approaches of the instant disclosure, to eliminate or mitigate such unwanted electrical coupling between the transistors 106, 108, isolation regions are utilized. These isolation regions provide physical separation between the transistors 106, 108 and comprise insulating materials to eliminate or decrease unwanted electrical coupling between the transistors 106, 108. In the example of FIG. 1, the isolation regions comprise (i) trenches 114, 116, 118, (ii) regions 120, 122, 123 that adjoin the respective trenches 114, 116, 118, and (iii) oxidized portions 124, 126 of the silicon substrate 104.

As shown in FIG. 1, the trenches 114, 116, 118 extend through the layers 110, 112, 128, 138. The trenches 114, 116, 118 are filled with insulating material (e.g., silicon dioxide), and sidewalls of the trenches 114, 116, 118 are coated with an etch stop layer 119. In examples, the etch stop layer 119 is an insulating material that is different than the insulating material used to fill the trenches 114, 116, 118 and may comprise a nitride material (e.g., SiN, etc.). As described below, in fabricating the structure 100, the etch stop layer 119 coating the sidewalls of the trenches 114, 116, 118 acts as an etch stop and prevents a wet etchant from etching portions of the structure disposed adjacent to the sidewalls.

As noted above, the isolation regions used in isolating the transistors 106, 108 further comprise the regions 120, 122, 123 that adjoin the respective trenches 114, 116, 118. Specifically, the region 120 adjoins the trench 114 at a bottom of the trench 114, the region 122 adjoins the trench 116 at a bottom of the trench 116, and the region 123 adjoins the trench 118 at a bottom of the trench 118, as shown in the illustration of FIG. 1. The regions 120, 122, 123 comprise insulating material (e.g., silicon dioxide) and extend laterally below the layers 110, 112, 128, 138 of the respective transistors 106, 108. Thus, for instance, the region 122 adjoins the trench 116 and extends in both a vertical direction (i.e., below the trench 116) and a lateral direction (i.e., extending laterally from the area below the trench 116, such that the region 122 is below the layers 110, 112, 128, 138 of the respective transistors 106, 108).

The isolation regions used in isolating the transistors 106, 108 further comprise the oxidized portions 124, 126 of the silicon substrate 104, as noted above. As shown in FIG. 1, the oxidized portion 124 adjoins the regions 120, 122, and the oxidized portion 126 adjoins the regions 122, 123. As described in further detail below with reference to FIGS. 2A-2V, the oxidized portions 124, 126 are formed via an oxidation diffusion process that converts these regions of the silicon substrate 104 from a silicon material to a silicon-oxide material, such as silicon dioxide.

The trenches 114, 116, 118, insulating regions 120, 122, 123, and oxidized portions 124, 126 form portions of a continuous or substantially continuous isolation region that electrically isolates the transistor 106 from the transistor 108. The isolation region thus eliminates or decreases unwanted electrical coupling between the transistors 106, 108, which can occur, for instance, when the transistors 106, 108 are operated at different body biases and/or in different power domains. By eliminating or decreasing this electrical coupling, performance degradation and/or circuit malfunctioning are likewise eliminated or decreased. The isolation region may be referred to as being "substantially continuous" if it includes one or more relatively small gaps or discontinuities (i.e., such that the isolation region is not totally continuous) but nevertheless provides the above-described elimination or reduction of unwanted electrical coupling between the transistors 106, 108.

Conventional approaches exist to providing isolation between components with different body biases. For example, under some conventional approaches, discrete GaN transistors (e.g., GaN transistors similar to the transistors 106, 108 depicted in FIG. 1) are separately bonded onto a printed circuit board or package substrate. These conventional approaches are deficient for several reasons. For example, parasitic inductance, parasitic resistance, and/or parasitic capacitance results due to the relatively large distance between the transistors. With such parasitics, the superior performance of GaN transistors cannot be realized.

In contrast to the conventional approaches, the structures and methods of the instant disclosure achieve electrical isolation between components without using the above-described bonding technique. Because a distance between the isolated components (e.g., the GaN transistors) is very small, the parasitic inductance, parasitic resistance, and/or parasitic capacitance of the conventional approaches are reduced. These advantages and others of the instant disclosure are described in further detail below.

Figure 2B:
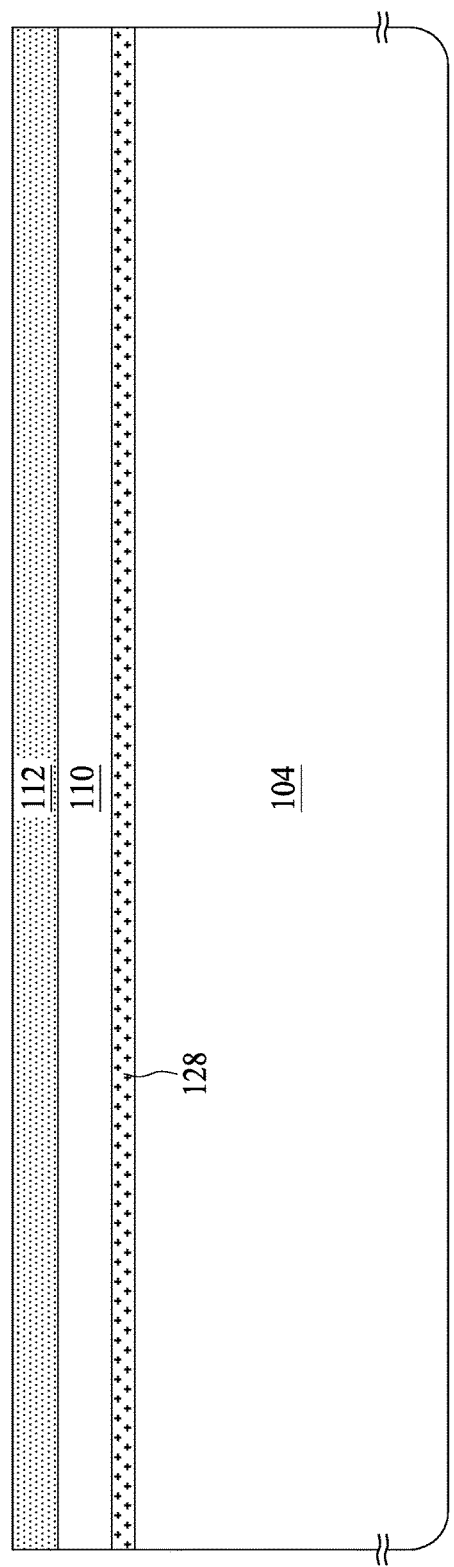
FIGS. 2A-2V illustrate steps of an example method for forming isolation regions for electrically isolating components formed on a common substrate, in accordance with some embodiments.
Figure 2C:
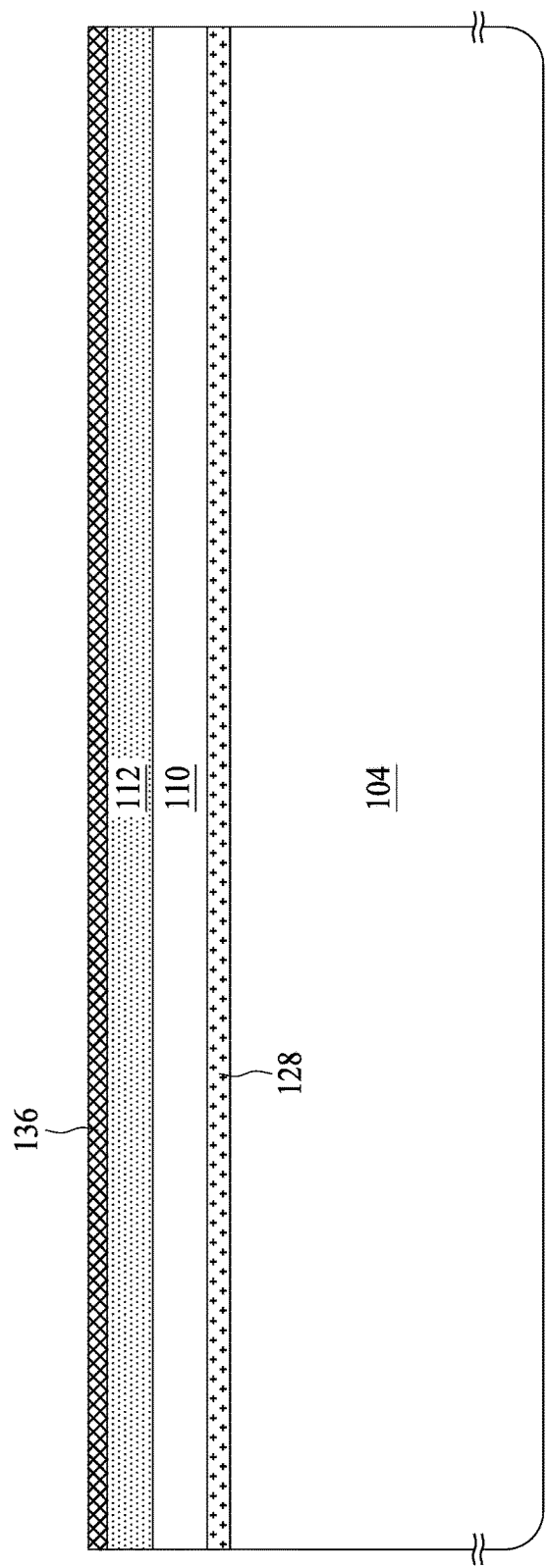
Figure 2D:
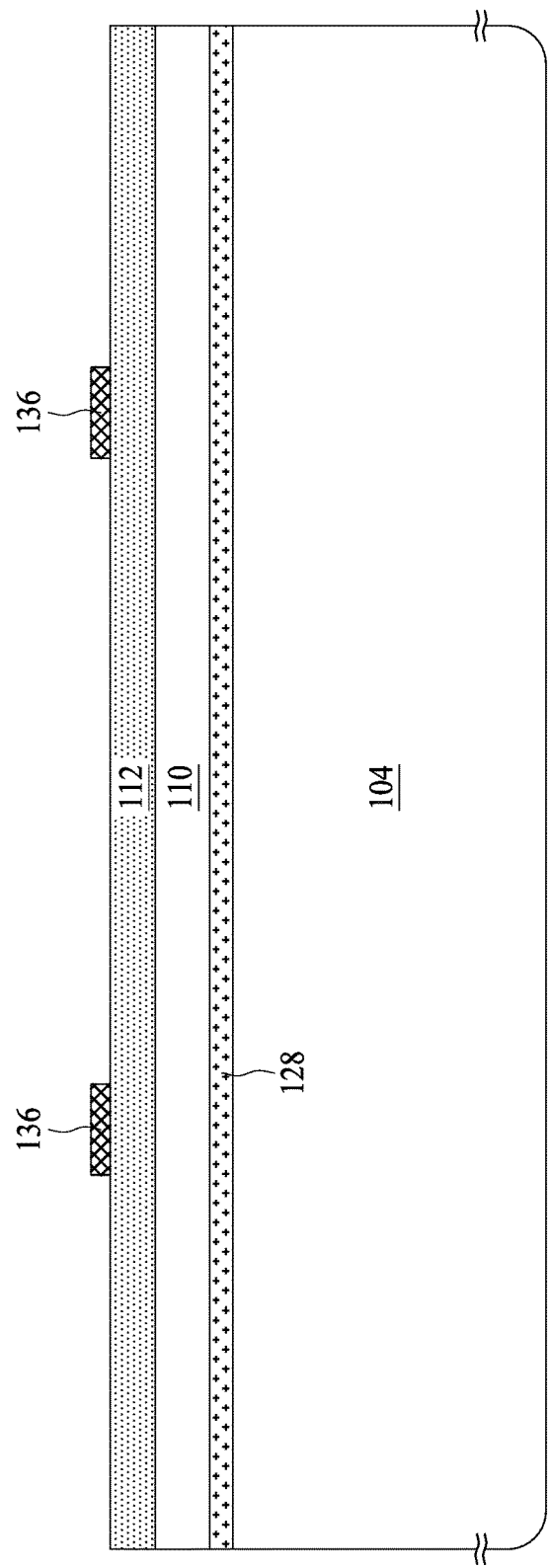
Figure 2E:
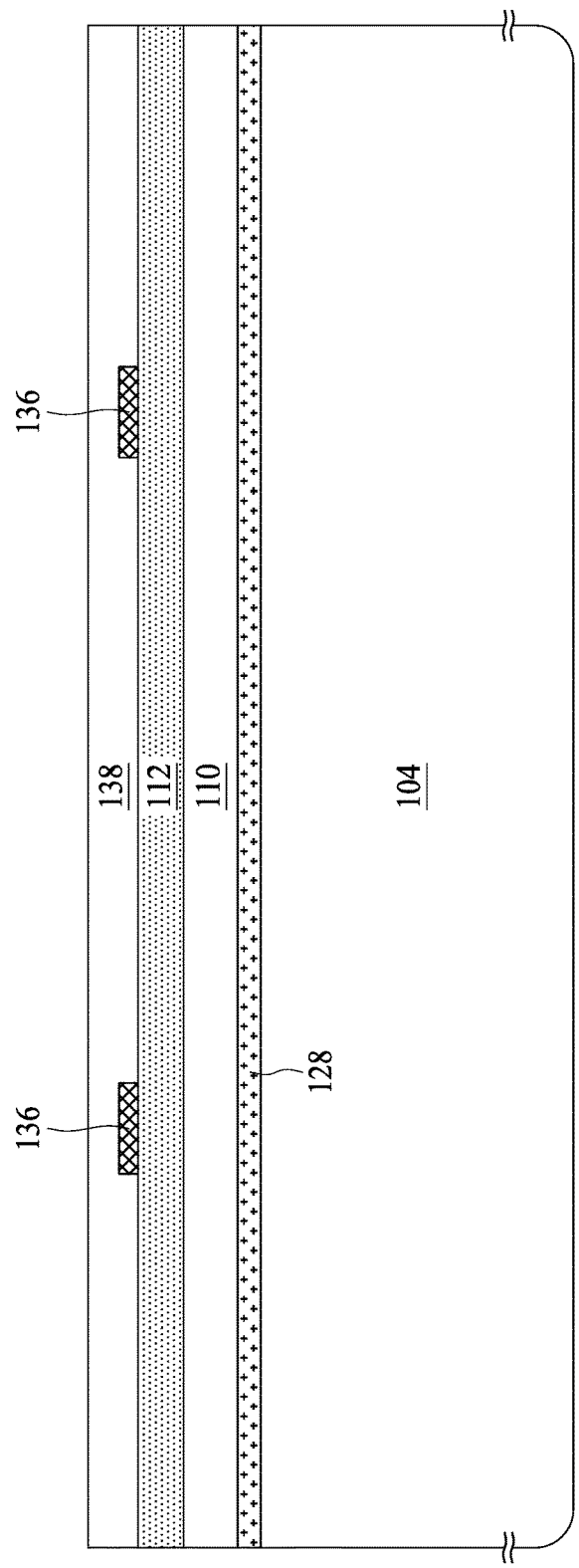
Figure 2F:
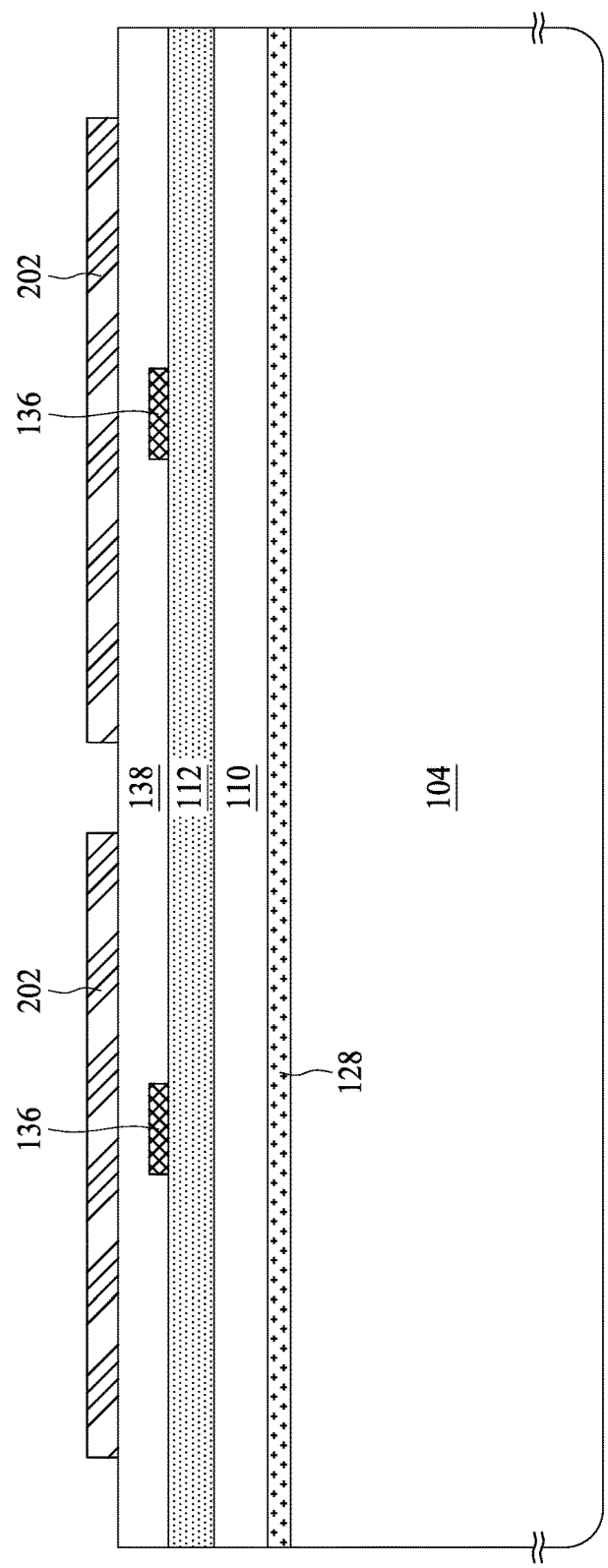
Figure 2G:
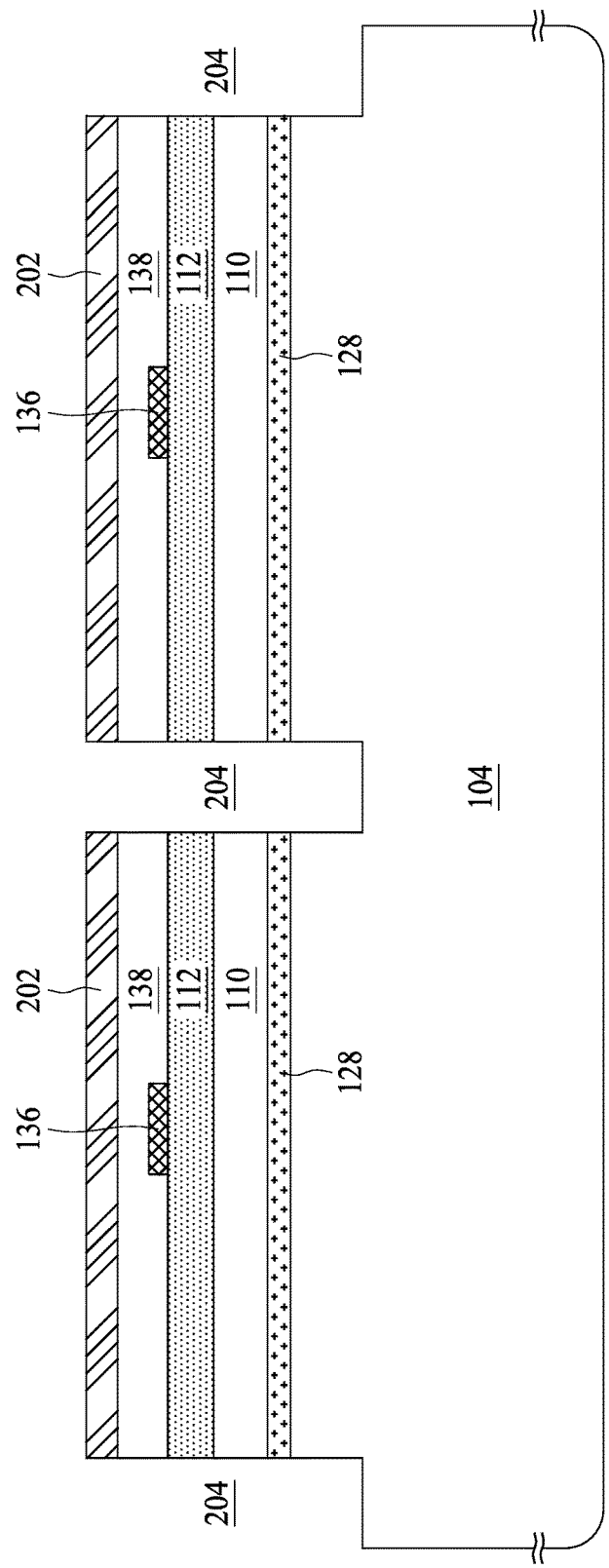
Figure 2H:
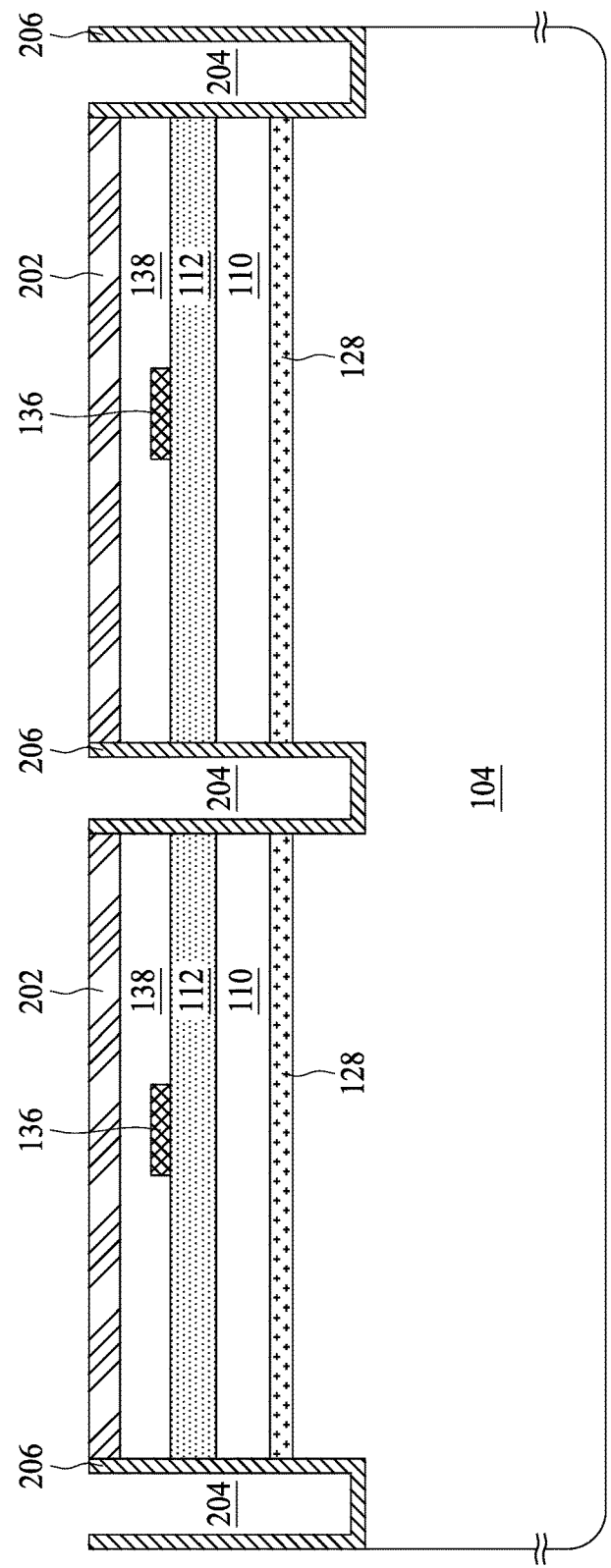
Figure 2I:
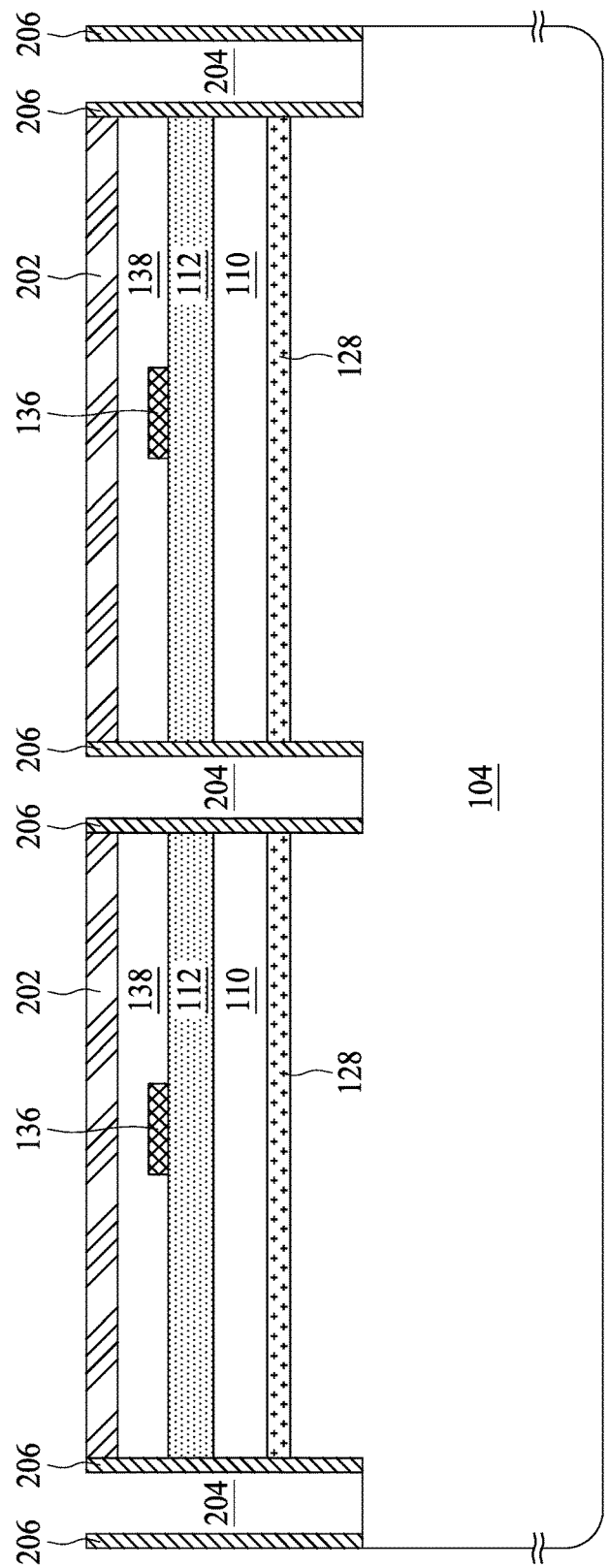
Figure 2J:
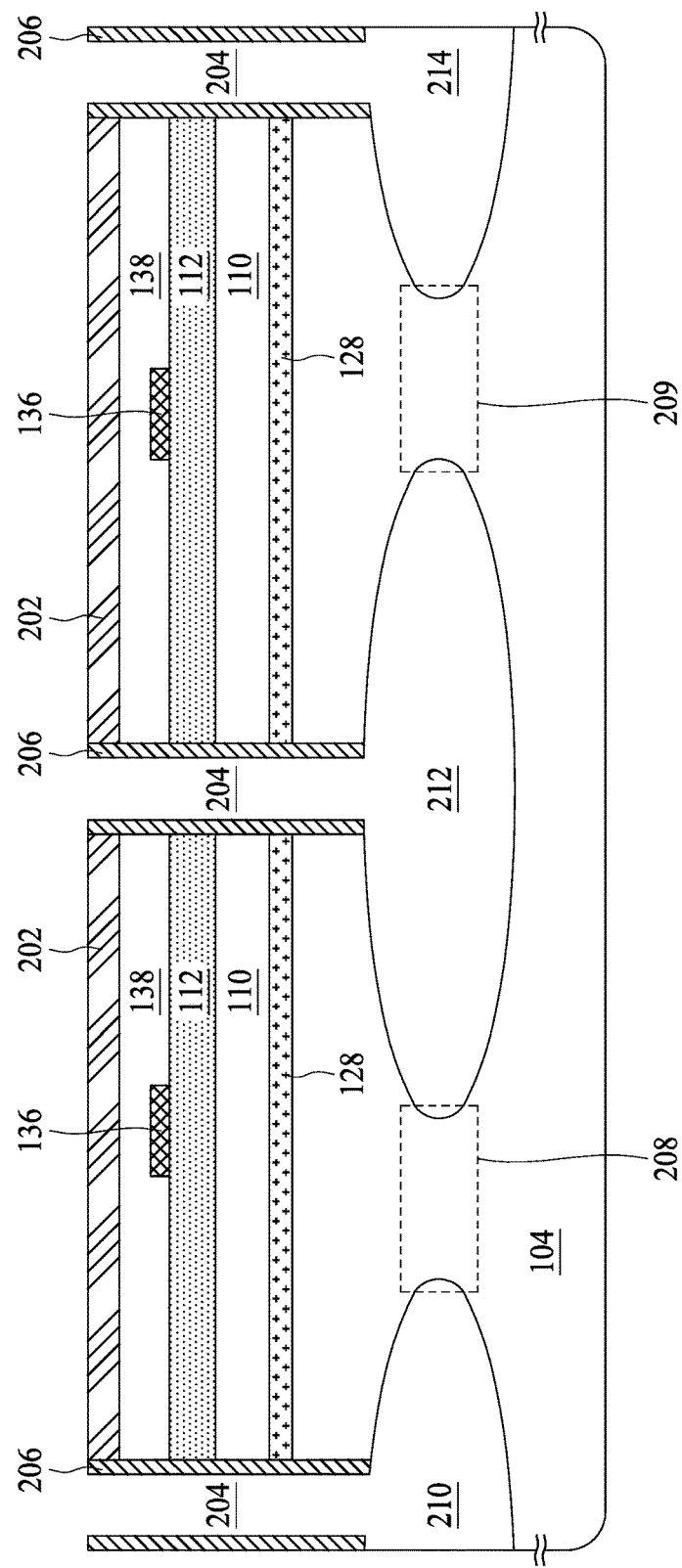
Figure 2K:
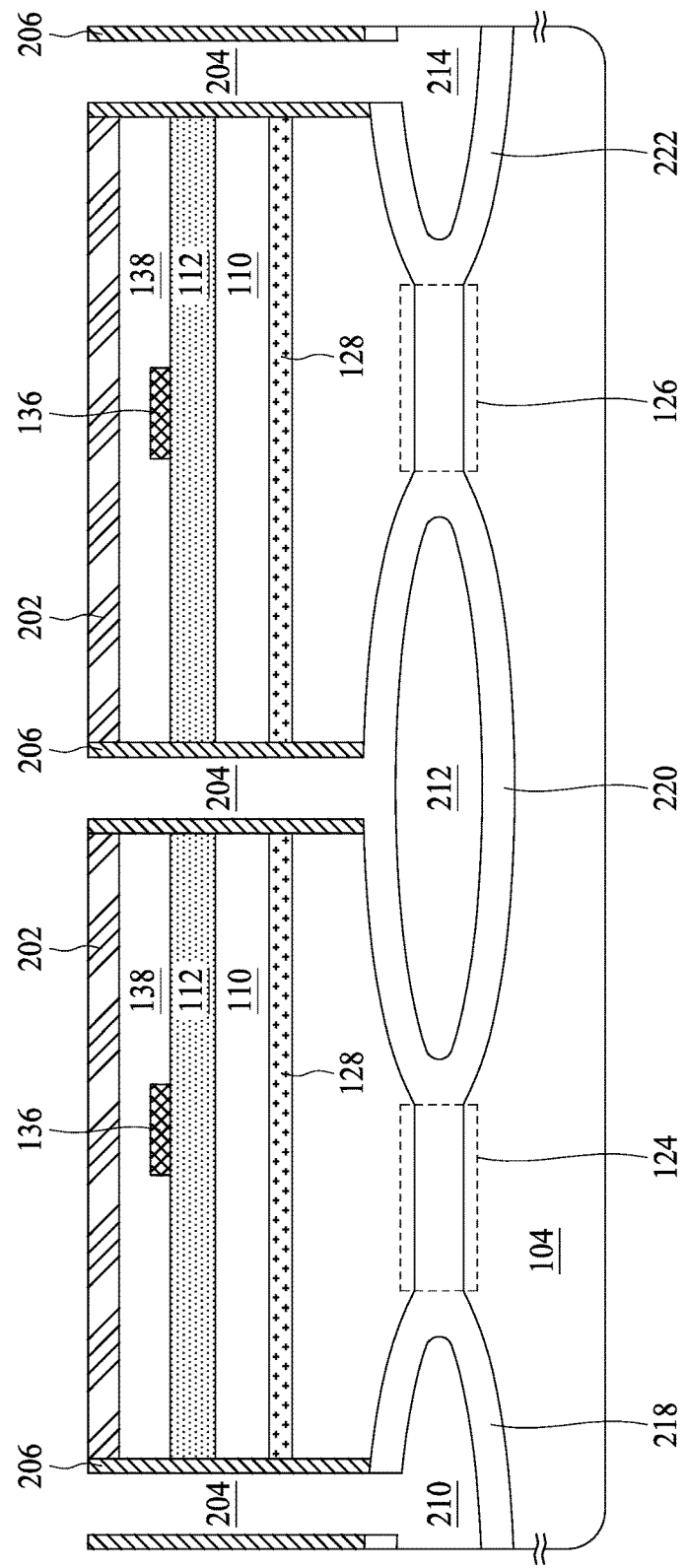
Figure 2L:
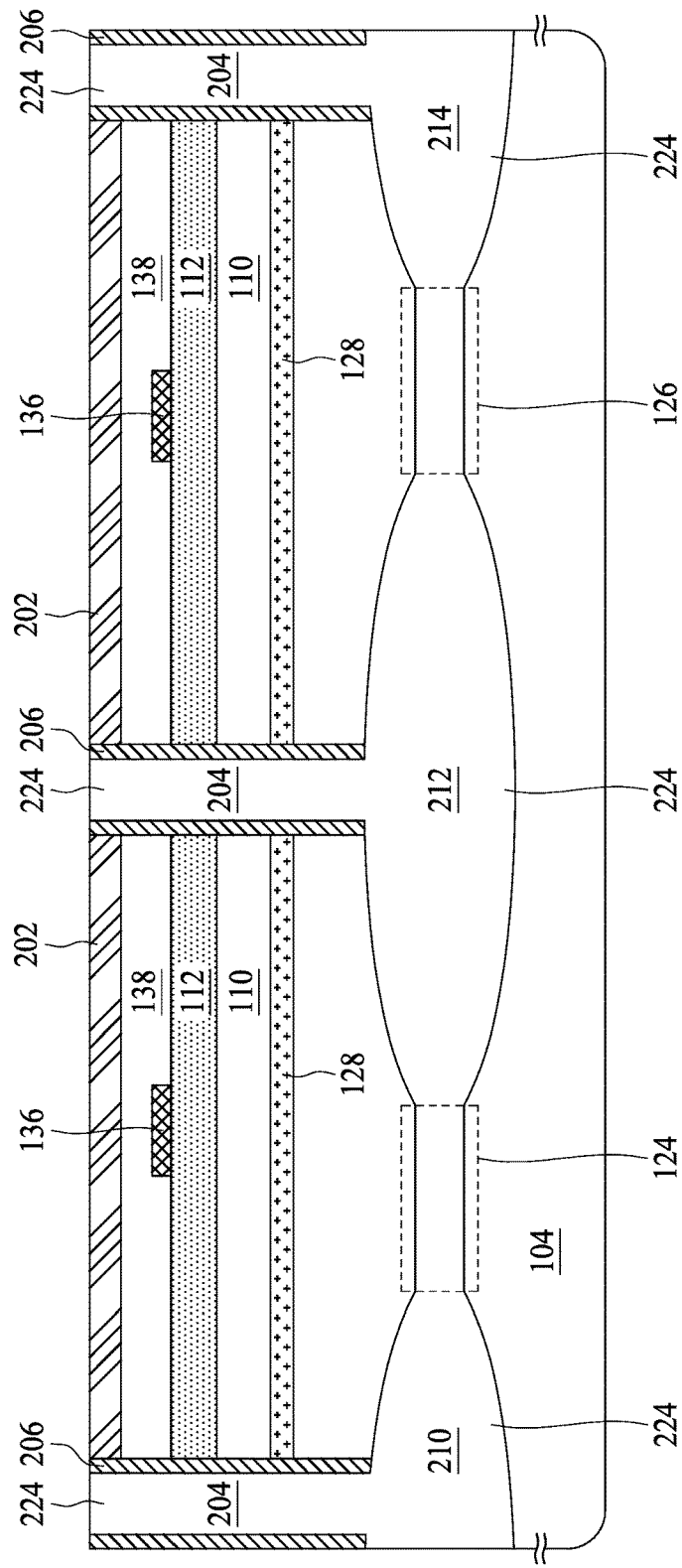
Figure 2M:
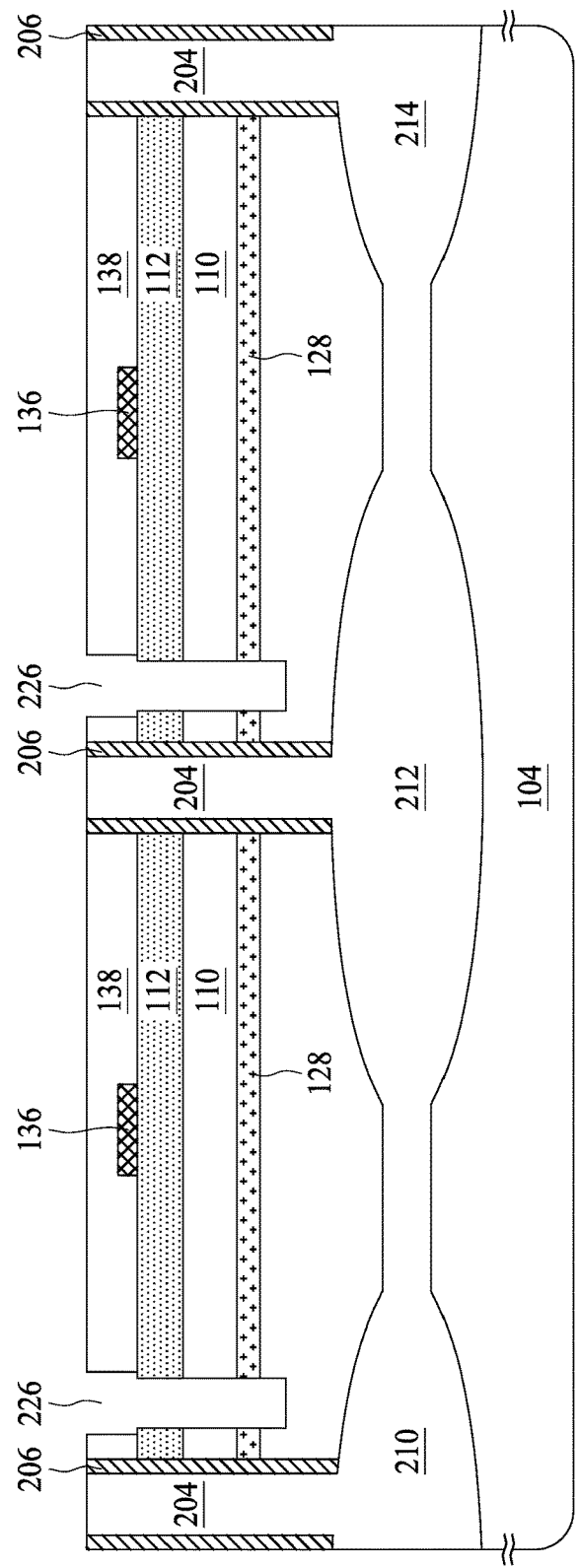
Figure 2N:
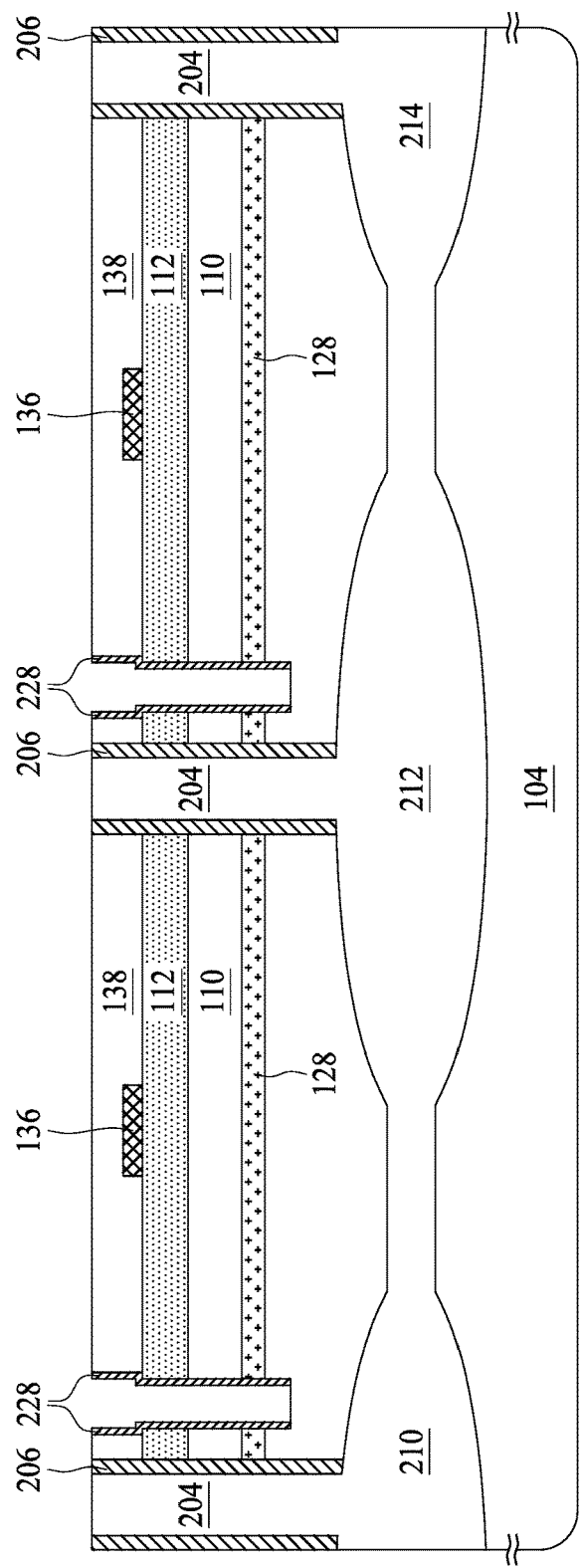
Figure 2O:
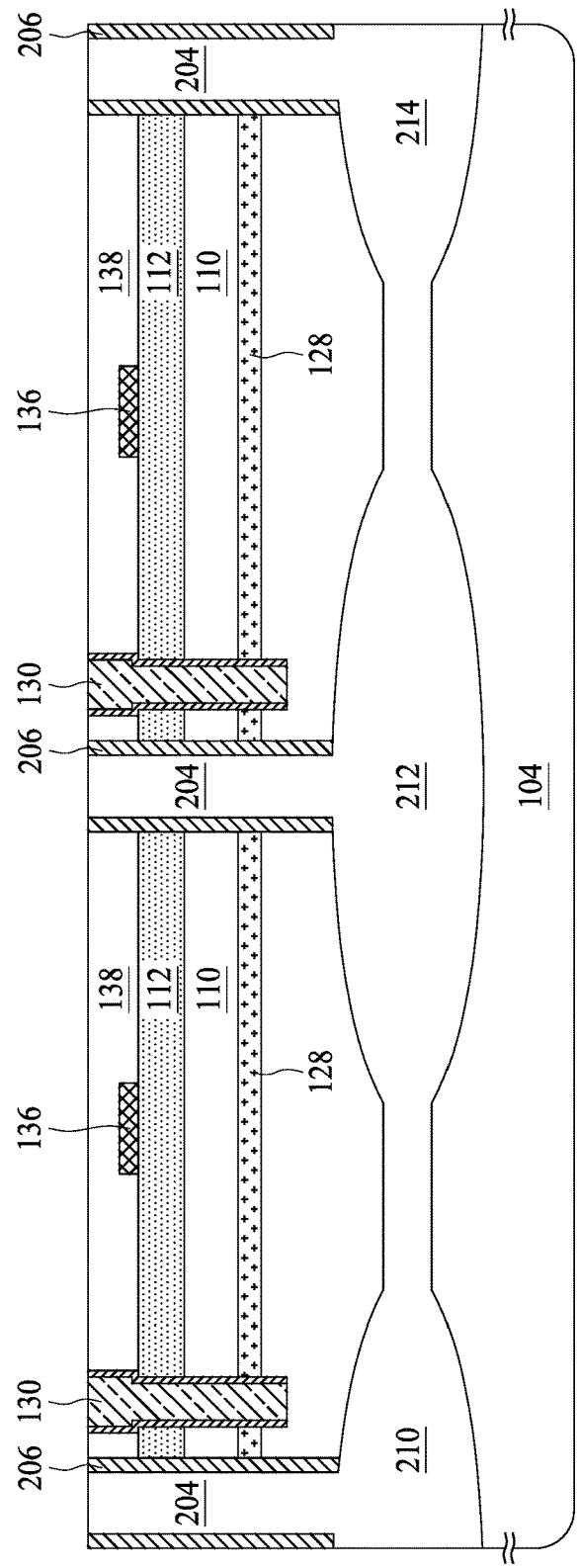
Figure 2P:
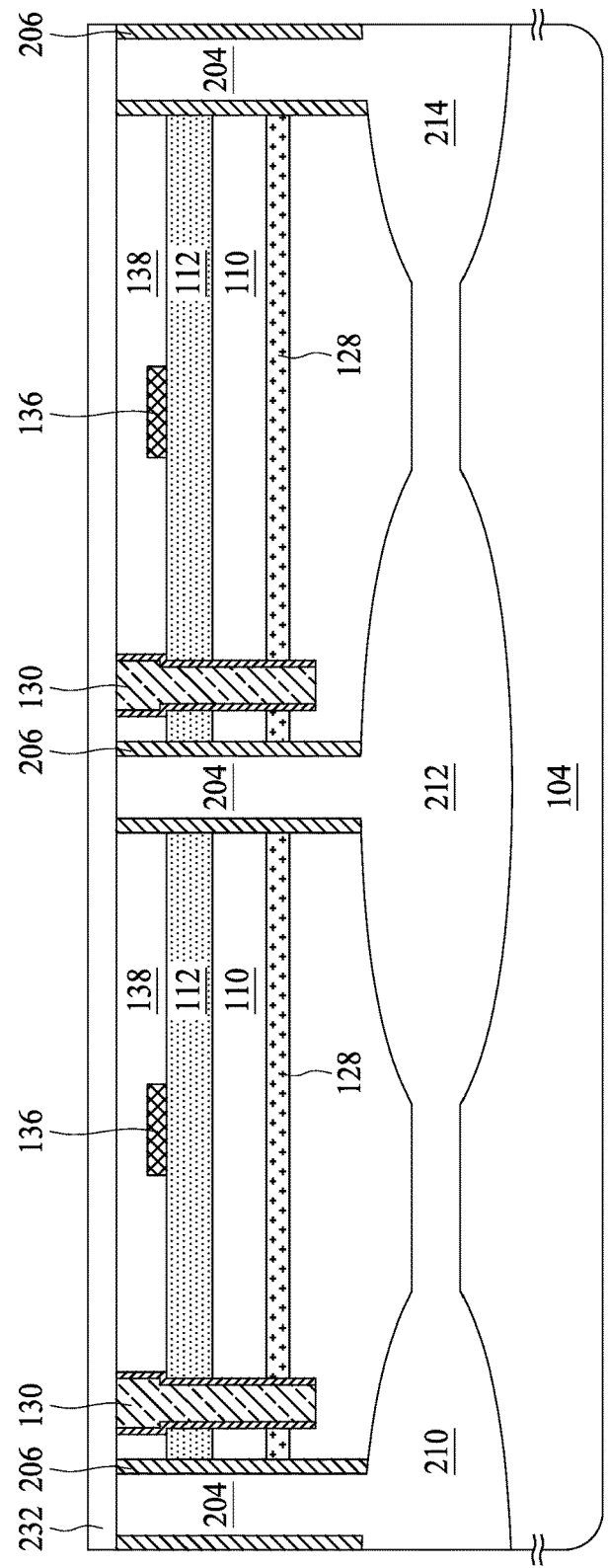
Figure 2Q:
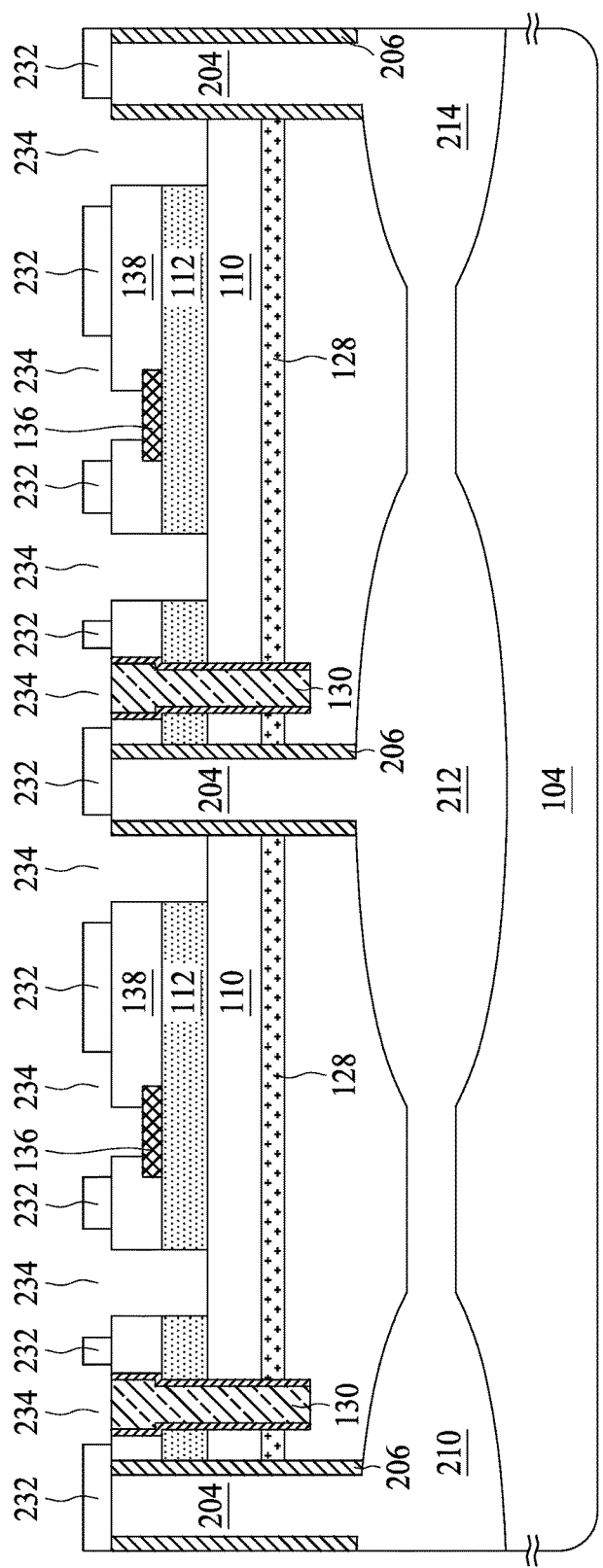
Figure 2R:
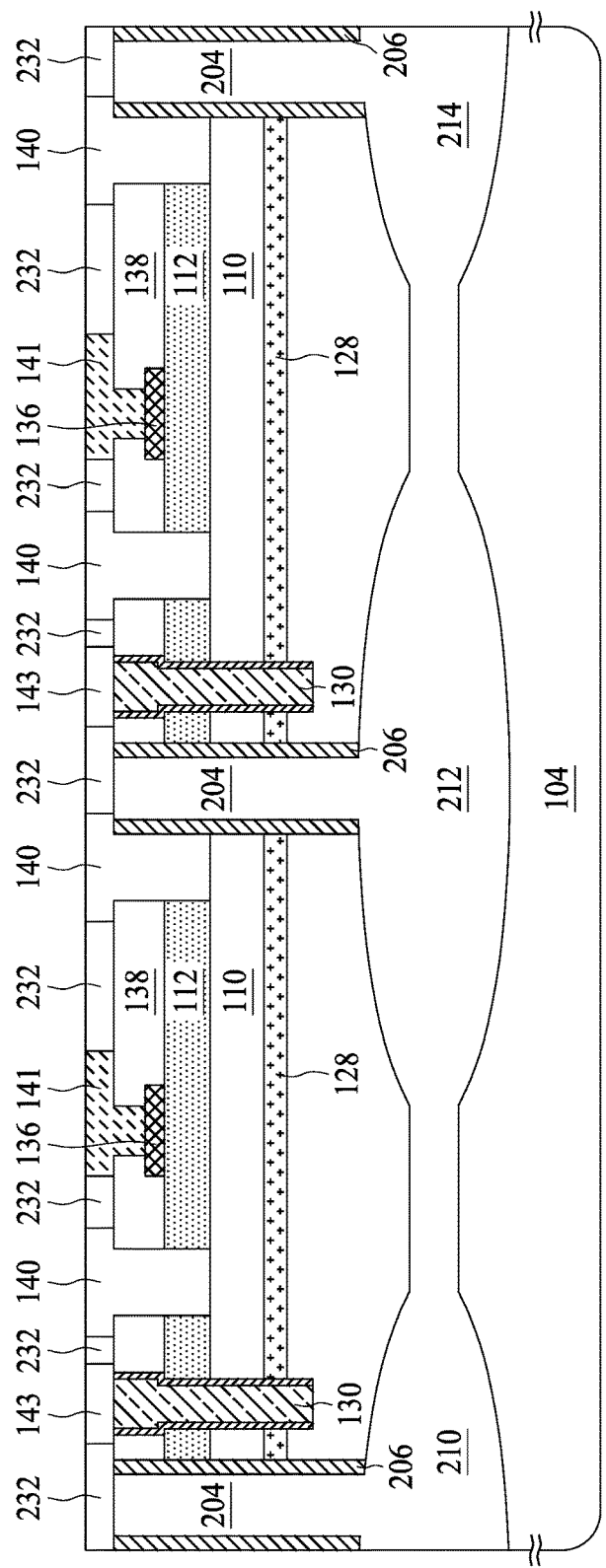
Figure 2S:
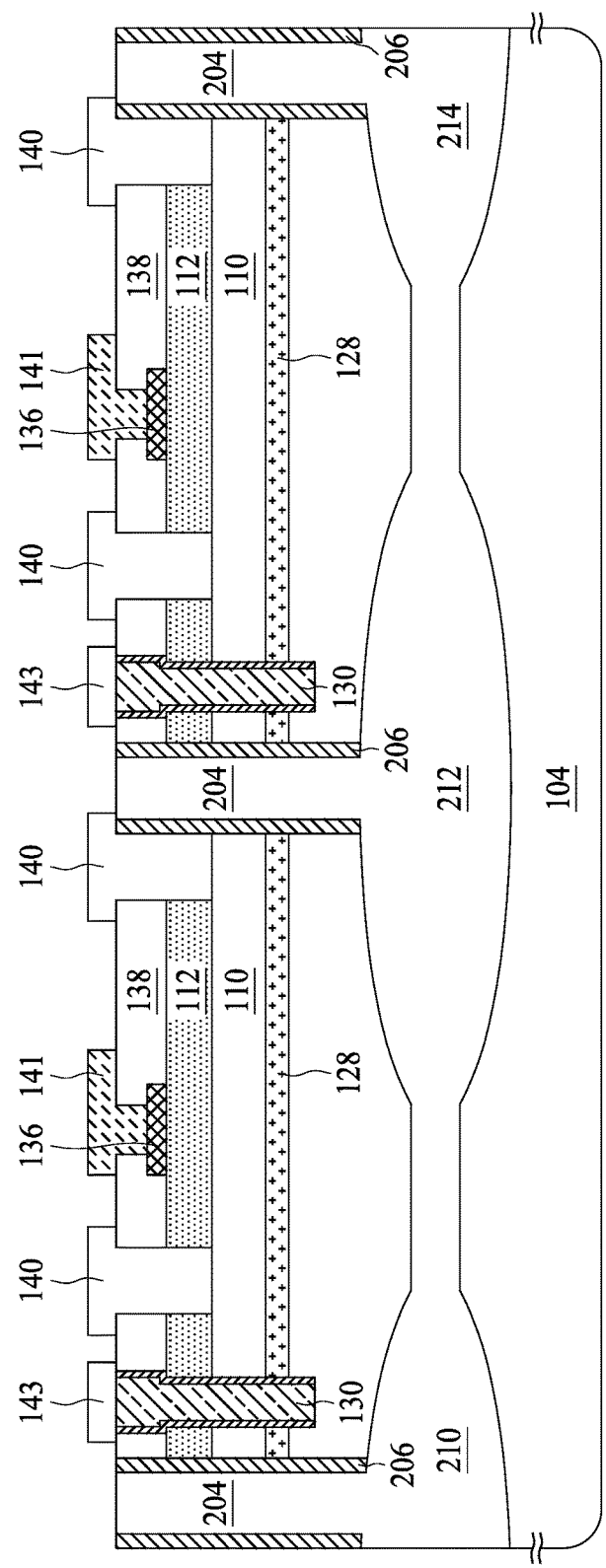
Figure 2T:
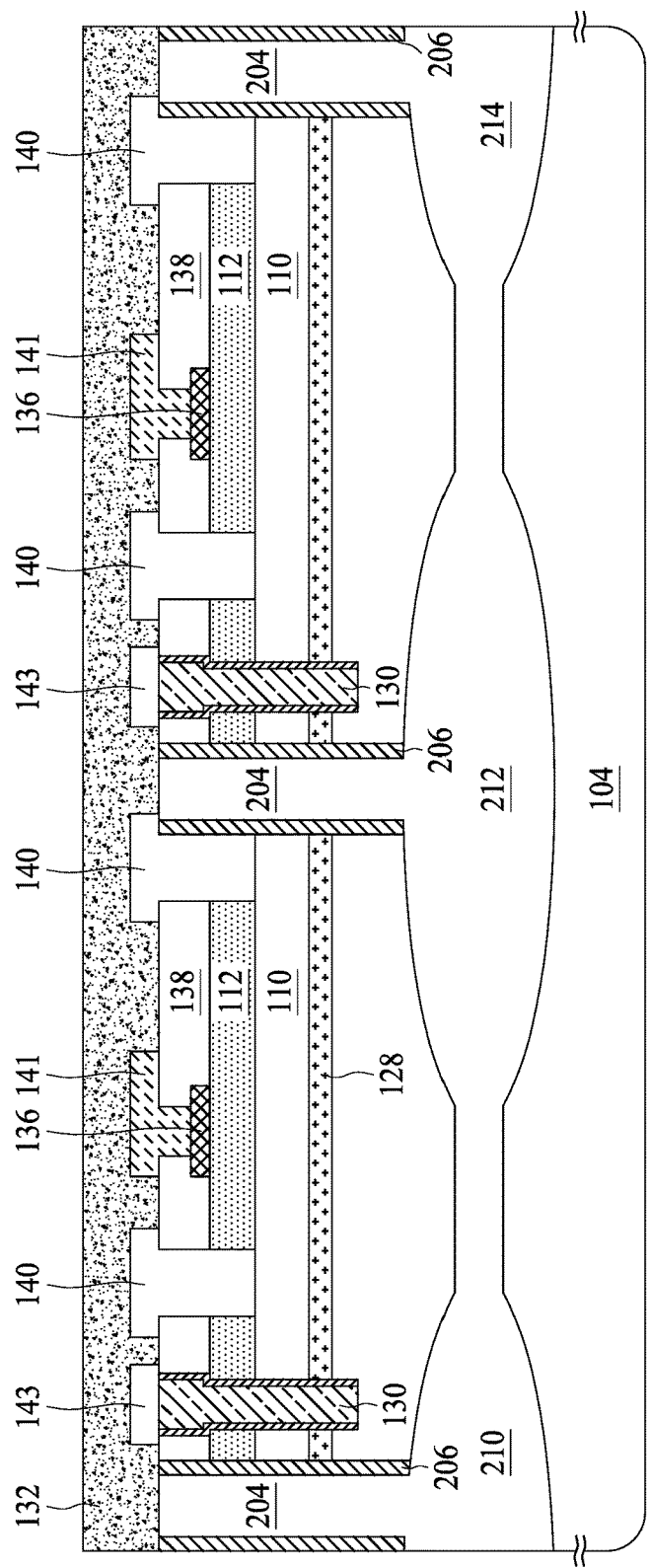
Figure 2U:
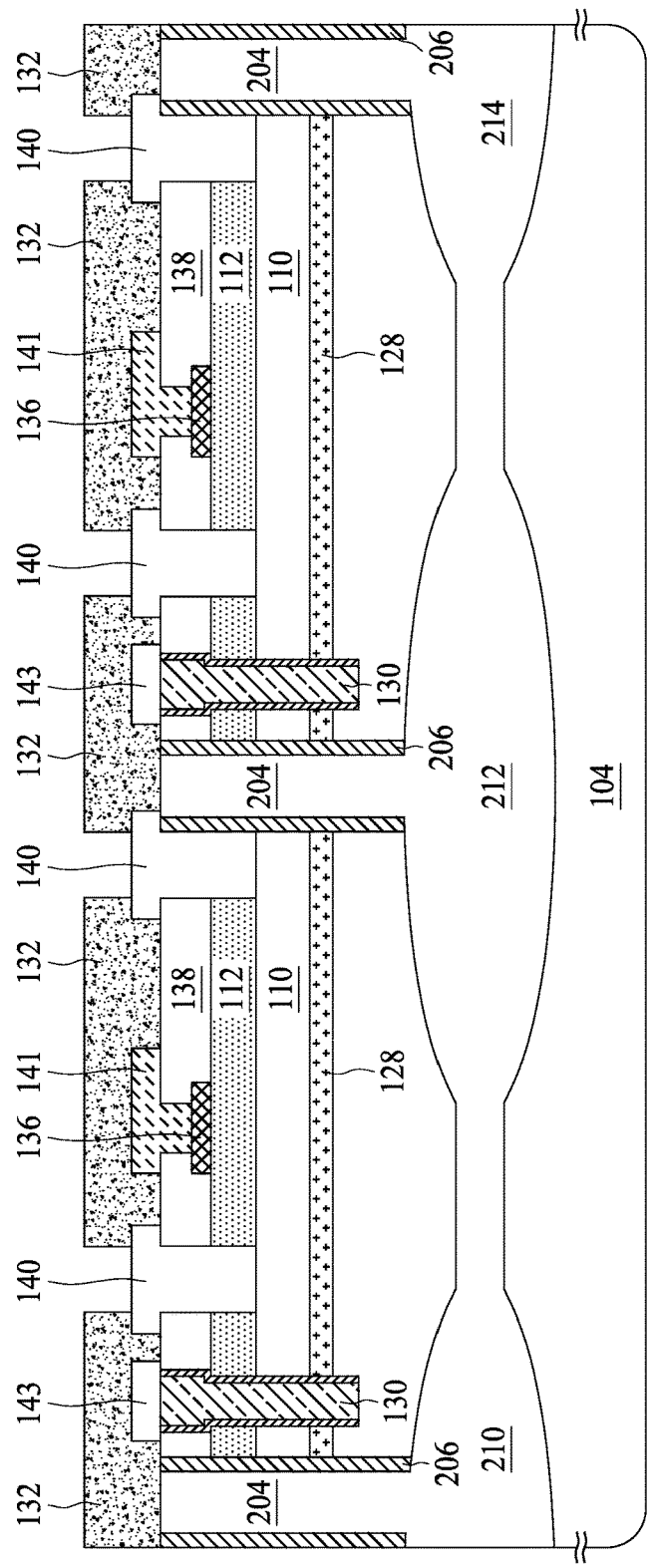
Figure 2V:
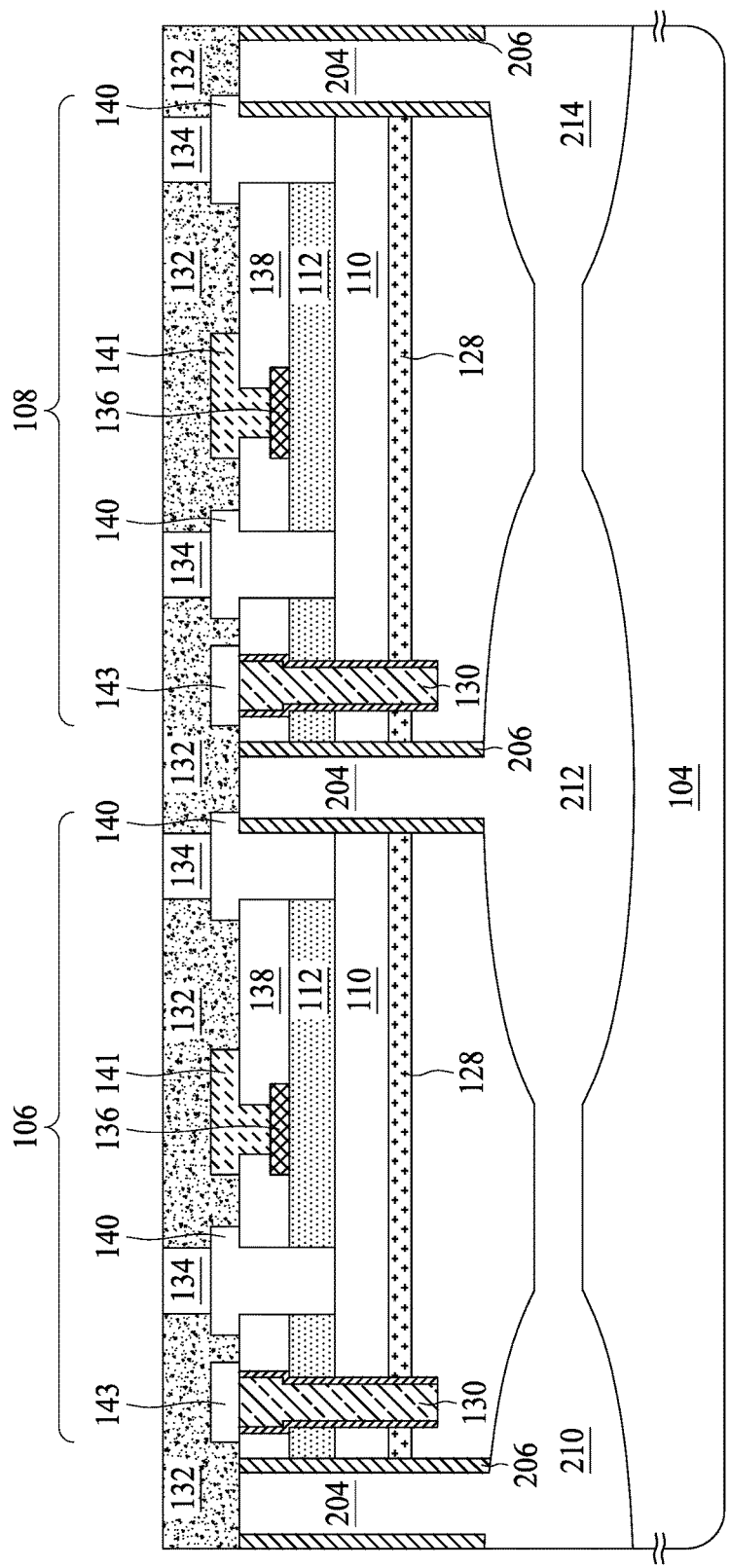

FIGS. 2A-2V illustrate steps of an example method for forming isolation regions for electrically isolating components formed on a common substrate 104, in accordance with some embodiments. These figures depict materials and structures that are the same as or similar to those of FIG. 1, and like reference numerals are used to designate like parts in these figures. As illustrated in FIG. 2A, the process begins with a bulk silicon substrate 104. As illustrated in FIG. 2B, GaN and AlGaN layers 110, 112 are formed over the silicon substrate 104 using epitaxial growth processes. The GaN layer 110 is formed over an optional transition layer 128 or directly on the silicon substrate 104. The AlGaN layer 112 is grown on the GaN layer 110, as illustrated in FIG. 2B. After the steps of FIGS. 2A-2V are complete, the GaN and AlGaN layers 110, 112 comprise portions of GaN transistors (e.g., HEMTs), as described in further detail below.

As illustrated in FIG. 2C, a polarization modulation layer 136 is formed over the AlGaN layer 112. In examples, the polarization modulation layer 136 is formed via an epitaxial process. As illustrated in FIG. 2D, the polarization modulation layer 136 is patterned to form island regions shown in the figure. The patterning of the polarization modulation layer 136 includes, in examples, (i) forming a masking layer (e.g., photoresist, etc.) over the polarization modulation layer 136, the masking layer including openings over the portions of the polarization modulation layer 136 that are to be removed, and (ii) removing the portions of the polarization modulation layer 136 that are left exposed by the masking layer (e.g., via a wet or dry etch procedure).

As illustrated in FIG. 2E, after the patterning of the polarization modulation layer 136, a passivation layer 138 is formed over the AlGaN layer 112 and over the remaining portions of the polarization modulation layer 136. The passivation layer 138 is formed, in examples, using a deposition procedure (e.g., chemical deposition, physical deposition, etc.). The passivation layer 138 is silicon oxide, silicon nitride, silicon oxynitride, carbon doped silicon oxide, carbon doped silicon nitride, carbon doped silicon oxynitride, zinc oxide, zirconium oxide, hafnium oxide, titanium oxide, or another suitable material. After depositing the passivation layer 138, the layer 138 undergoes a polishing and/or etching procedure, in examples. The polishing and/or etching procedure includes, in examples, a chemical-mechanical planarization (CMP) (i.e., chemical-mechanical polishing) process that is used to polish the surface of the layer 138 and remove topographical irregularities.

Steps illustrated in FIGS. 2F and 2G are used in forming deep trenches 204. In the step illustrated in FIG. 2F, a masking layer 202 is formed over the passivation layer 138. The masking layer 202 comprises photoresist, a hard mask material, or another masking material that is able to withstand an etching process used to form the trenches 204. As illustrated in FIG. 2F, the masking layer 202 is patterned with openings, where the openings are formed over the portions of the structure in which the deep trenches 204 are to be formed. As shown in FIG. 2G, the deep trenches 204 are formed by etching portions of the semiconductor structure that are left exposed by the masking layer 202. The deep trenches 204 extend through the layers 110, 112, 128, 138 and into the silicon substrate 104. In examples, the trenches 204 are formed via a dry etch process that is directional (i.e., anisotropic), with the etching occurring primarily in the vertical direction.

As illustrated in FIG. 2H, an etch stop layer 206 is deposited over sidewalls and bottoms of the deep trenches 204. In examples, the etch stop layer 206 comprises an insulating material (e.g., a nitride material, such as SiN). As described below, the etch stop layer 206 acts as an etch stop and prevents a wet etchant from etching portions of the structure disposed adjacent to the sidewalls. As illustrated in FIG. 2I, portions of the etch stop layer 206 coating bottoms of the trenches 204 are removed (e.g., via an etching procedure).

In the step illustrated in FIG. 2J, a wet etchant (e.g., HNA, which includes hydrofluoric acid, nitric acid, and acetic acid) is introduced into the trenches 204. Because the portions of the etch stop layer 206 coating the bottoms of the trenches 204 were removed in the previous step, this enables the wet etchant to penetrate into portions of the silicon substrate 104 below the trenches 204. Specifically, the wet etchant etches openings 210, 212, 214 below the trenches 204. As shown in FIG. 2J, the openings extend laterally below the layers 110, 112, 128, 138 of the structure. The openings 210 and 212 are separated by a portion 208 of the silicon substrate 104 adjoining the openings 210, 212, and the openings 212 and 214 are separated by a portion 209 of the silicon substrate 104 adjoining the openings 212, 214. The wet etching illustrated in FIG. 2J may be characterized as isotropic etching, because the wet etchant etches horizontally as well as vertically.

When the wet etchant is introduced into the trenches 204, the remaining portions of the etch stop layer 206 act as an etch stop and prevents the wet etchant from etching portions of the structure disposed adjacent to the sidewalls. This is shown in FIG. 2J, which shows that portions of the structure disposed adjacent to the sidewalls are not affected by the wet etchant.

It is noted that in examples, the trenches 204 and openings 210, 212, 214 are formed via a combination of dry and wet etching processes. Specifically, in examples, the trenches 204 are formed via a dry etching process. After forming the trenches 204 via the dry etching process (e.g., an anisotropic dry etching process that etches only in the vertical direction), the wet etchant can be introduced into the trenches 204 to etch the openings 210, 212, 214 below the trenches 204. The use of the wet etchant enables the lateral etching below the layers 110, 112, 128, 138, which may not be possible via dry etching techniques. In examples, the lateral etching is controlled in a manner such that sizes of the silicon portions 208, 209 are relatively small. By keeping the sizes of the silicon portions 208, 209 relatively small, these portions 208, 209 can be oxidized (e.g., converted from the silicon material to an insulating silicon-oxide material, such as silicon dioxide), as described below.

In the step illustrated in FIG. 2K, a diffusion process is used to oxidize surfaces 218, 220, 222 of the openings 210, 212, 214. The diffusion process also oxidizes the portions 208, 209 of the silicon substrate 104 adjoining the openings 210, 212, 214. The diffusion process thus oxidizes the portions 208, 209 to form the oxidized portions 124, 126 shown in FIG. 2K. In oxidizing the surfaces 218, 220, 222 and the portions 208, 209, portions of the silicon substrate 104 are converted from silicon material to an insulating silicon-oxide material, such as silicon dioxide. In an example diffusion oxidation process, a gas including oxygen is introduced into the trenches 204 and openings 210, 212, 214. The structure is heated to a relatively high temperature (e.g., 800-1000 degrees Celsius, in examples). Under the relatively high temperature, when the silicon of the surfaces 218, 220, 222 and the portions 208, 209 is exposed to the oxygen gas, the silicon and the oxygen react, thus resulting in a thermal diffusion that forms the silicon-oxide.

In the step illustrated in FIG. 2L, an insulating material 224 is deposited, with the insulating material 224 filling the openings 210, 212, 214 and the trenches 204. The insulating material 224 comprises an oxide material (e.g., silicon dioxide, etc.) or another dielectric material, in examples.

At a completion of the step shown in FIG. 2L, a continuous or substantially continuous isolation region has been formed. Specifically, the isolation region includes (i) the trenches 204 and openings 210, 212, 214 filled with the insulating material 224, and (ii) the oxidized portions of the silicon substrate 104. The oxidized portions of the silicon substrate 104 include the oxidized portions 124, 126 and the oxidized surfaces 218, 220, 222 described above with reference to FIG. 2K. In subsequent steps described below, the first GaN transistor 106 is formed in a left-hand portion of the structure, and the second GaN transistor 108 is formed in a right-hand portion of the structure. The isolation region electrically isolates the transistor 106 from the transistor 108, thus eliminating or decreasing unwanted electrical coupling between the transistors 106, 108. By eliminating or decreasing this electrical coupling, performance degradation and/or malfunctioning of the GaN transistors 106, 108 are likewise eliminated or decreased.

It is noted that in examples, the isolation region is formed via a combination of (i) a diffusion oxidation process, and (ii) an insulator deposition process. As described above with reference to FIG. 2K, the diffusion process is used to oxidize portions of the silicon substrate 104 (e.g., surfaces 218, 220, 222 and portions 208, 209 shown in FIG. 2J). The insulator deposition process shown in FIG. 2L fills the trenches 204 and the openings 210, 212, 214 with the insulating material 224. The diffusion process enables the oxidizing of the portions 208, 209, which would not be possible via a standard deposition process. The subsequent insulator deposition process enables the efficient filling of the trenches 204 and the openings 210, 212, 214.

FIGS. 2M-2V illustrate steps used in forming GaN transistors 106, 108 (e.g., GaN HEMT transistors 106, 108) in the semiconductor structure. As illustrated in FIG. 2M, via openings 226 are etched into the structure. The via openings 226 extend through the layers 110, 112, 128, 138 and into the silicon substrate 104. An insulating material 228 is deposited that coats sidewalls and bottoms of the via openings 226. Portions of the insulating material 228 that coat the bottoms of the via openings 226 are removed, as illustrated in FIG. 2N. The insulating material 228 comprises, for instance, a nitride material, such as SiN, or another dielectric material.

As illustrated in FIG. 2O, the via openings 226 are filled with a conductive material 130. The conductive material 130 forms portions of contacts that extend from the surface of the structure to the silicon substrate 104. After filling the via openings 226 with the conductive material 130, the structure undergoes a polishing and/or etching procedure, in examples. The polishing and/or etching procedure includes, in examples, a CMP process that is used to polish the surface of the structure and eliminate topographical irregularities.

In the step illustrated in FIG. 2P, a masking layer 232 is formed over the structure. The masking layer 232 comprises photoresist, a hard mask material, or another masking material that is able to withstand a subsequent etching process used to form source, drain, gate, and body bias features of the transistors 106, 108. As illustrated in FIG. 2Q, the masking layer 232 is patterned with openings 234, where the openings 234 are formed over the portions of the structure in which the source, drain, gate, and body bias features are to be formed. As shown in FIG. 2Q, areas for the source, drain, gate, and body bias features are formed by etching portions of the semiconductor structure that are left exposed by the openings 234 of the masking layer 232. Conductive material is deposited in the openings, as illustrated in FIG. 2R. The conductive material forms the source and drain features 140, gate structures 141, and body bias features 143, as shown in FIG. 2R. After depositing the conductive material, the structure undergoes a polishing and/or etching procedure (e.g., a CMP process), in examples.

As illustrated in FIG. 2S, the masking material 232 is removed. Next, as shown in FIG. 2T, a dielectric material 132 (labeled "inter-layer dielectric" or "ILD" in the example of FIG. 2T) is formed over the structure. In FIGS. 2U and 2V, the dielectric material 132 is patterned, and metal contacts 134 are deposited over the source and drain features 140.

At the completion of the steps shown in FIGS. 2A-2V, GaN transistors 106, 108 have been formed. Under the approaches of the instant disclosure, the isolation regions described above (e.g., the isolation regions including (i) the trenches 204 and openings 210, 212, 214 filled with the insulating material 224, and (ii) the oxidized portions of the silicon substrate 104) eliminate or decrease unwanted electrical coupling between the transistors 106, 108. The isolation regions provide physical separation between the transistors 106, 108 and comprise insulating materials to eliminate or decrease the unwanted electrical coupling between the transistors 106, 108.

In examples, certain of the steps described above with reference to FIGS. 2A-2V are not performed. In other examples, additional steps not expressly described above are performed. Further, in examples, certain of the steps described above with reference to FIGS. 2A-2V are modified or performed in a different order than described above.

The instant disclosure provides examples in which isolation regions are used to electrically isolate GaN transistors (e.g., GaN transistors 106, 108) formed on a silicon substrate. It is noted, however, that the instant disclosure is not limited to this context. For example, although GaN and AlGaN III-V semiconductor materials (i.e., Group III-Group V semiconductor materials) are utilized in examples described above, in other examples, different III-V semiconductor materials (e.g., GaAs, AlGaAs, AlGaInP, etc.) are utilized. More generally, the isolation structures and methods for forming isolation structures described herein can be used in semiconductor structures that do not include III-V semiconductor materials. Thus, to illustrate features of the instant disclosure at a higher level of abstraction, reference is made to FIG. 3. This figure depicts a semiconductor structure 300 including portions 306, 308 that are electrically isolated from each other using an isolation channel, in accordance with some embodiments.

In examples, the portions 306, 308 comprise various different structures and/or components that are formed on a common substrate 304. The portions 306, 308 may comprise, for instance, various different layers (e.g., semiconductor layers, insulating layers, metallic layers, metal alloy layers, etc.), integrated circuits, transistors, and/or other electrical components. The portions 306, 308 may or may not include III-V semiconductor materials. The substrate 304 may comprise, for instance, a semiconductor substrate, such as silicon, or another type of substrate.

Figure 3:
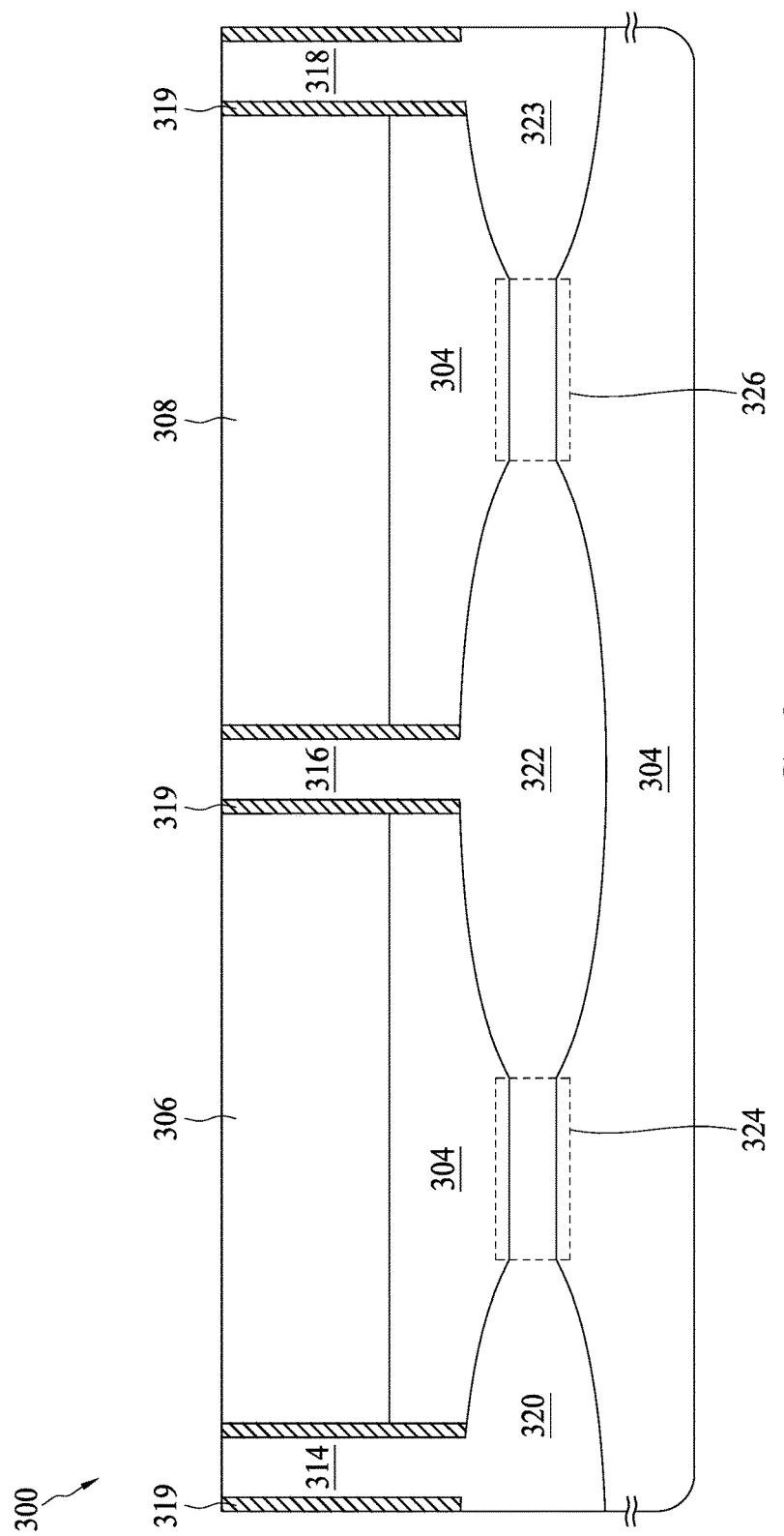
FIG. 3 depicts a semiconductor structure including components that are electrically isolated from each other using an isolation region, in accordance with some embodiments.

Under the approaches of the instant disclosure, to eliminate or mitigate unwanted electrical coupling between the portions 306, 308, an isolation channel is utilized. The isolation channel provides physical separation between the portions 306, 308 and comprises insulating materials to eliminate or decrease unwanted electrical coupling between the portions 306, 308. In the example of FIG. 3, the isolation channel includes (i) trenches 314, 316, 318, (ii) regions 320, 322, 323 that adjoin the respective trenches 314, 316, 318, and (iii) portions 324, 326 adjoining the regions 320, 322, 323. Sidewalls of the trenches 314, 316, 318 are coated with an insulating material 319, such as silicon nitride or another nitride. In fabricating the structure 300, the material 319 coating the sidewalls of the trenches 314, 316, 318 acts as an etch stop and prevents a wet etchant from etching portions of the structure disposed adjacent to the sidewalls, in examples.

The isolation channel is formed using steps similar to those described above with reference to FIGS. 2A-2L. Such steps include, among others, (i) etching deep trenches through the portions 306, 308 (e.g., via a dry etch process or a wet etch process, etc.), (ii) depositing the insulating material 319 on sidewalls of the deep trenches, (iii) introducing a wet etchant into the deep trenches to form openings in the substrate 304 that are adjoined to bottoms of the deep trenches, (iv) performing a diffusion process to oxidize portions of the substrate 304 adjoining the openings, and (v) depositing an oxide or dielectric material to fill the openings and the deep trenches.

Figure 4:
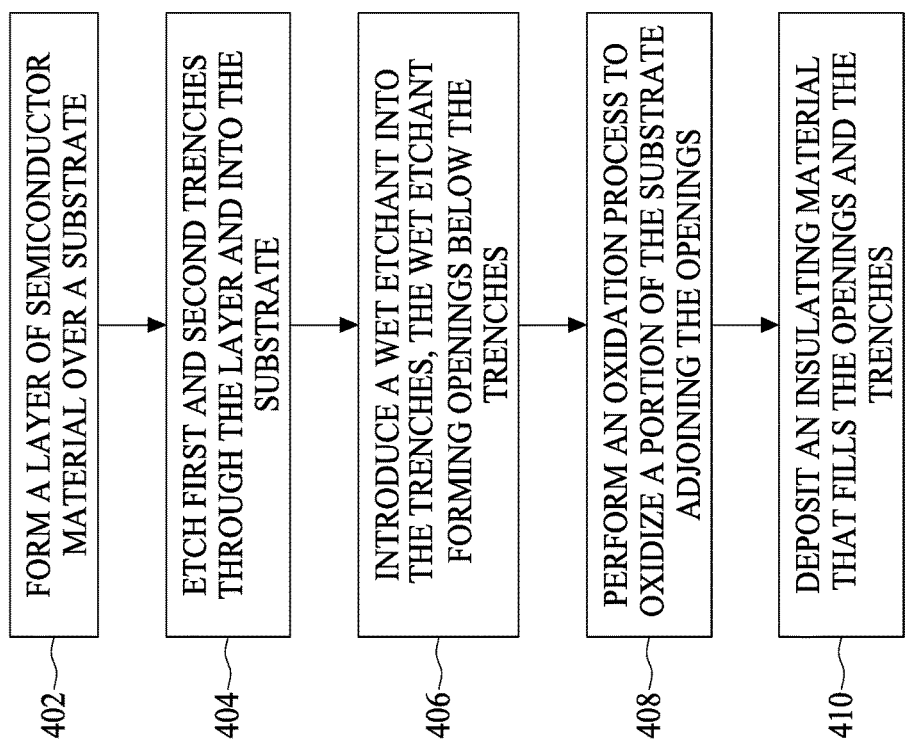
FIG. 4 is a flowchart illustrating an example method of forming a semiconductor structure, in accordance with some embodiments.

FIG. 4 is a flowchart illustrating an example method of forming a semiconductor structure, in accordance with some embodiments. At 402, a semiconductor layer (e.g., a GaN layer 110, as illustrated in FIG. 2B) is formed over a silicon substrate. The semiconductor layer comprises a III-V semiconductor material, in examples. At 404, first and second trenches (e.g., trenches 204, as illustrated in FIG. 2G) are etched, where each of the first and second trenches extends through the layer and into the silicon substrate. At 406, a wet etchant is introduced into the trenches, where the wet etchant etches a first opening below the first trench and a second opening below the second trench (e.g., openings 212, 214 shown in FIG. 2J). Each of the first and second openings extends laterally below the layer. The first and second openings are separated by a portion of the silicon substrate adjoining the first and second openings (e.g., portion 209 shown in FIG. 2J). At 408, an oxidation process is performed to oxidize (i) surfaces of the first and second openings (e.g., surfaces 220, 222 shown in FIG. 2K), and (ii) the portion of the silicon substrate adjoining the first and second openings. At 410, an insulating material (e.g., insulating material 224 shown in FIG. 2L) is deposited that fills the openings and the trenches.

The present disclosure is directed to semiconductor structures including isolation regions and methods of forming the same. In an example method of forming a semiconductor structure having a substrate, a layer of semiconductor material is formed over the substrate. First and second trenches are etched, where each of the first and second trenches extends through the layer and into the substrate. A wet etchant is introduced into the trenches, where the wet etchant etches a first opening below the first trench and a second opening below the second trench. Each of the first and second openings extends laterally below the layer. The first and second openings are separated by a portion of the substrate adjoining the first and second openings. An oxidation process is performed to oxidize (i) surfaces of the first and second openings, and (ii) the portion of the substrate adjoining the first and second openings. An insulating material is deposited that fills the openings and the trenches.

In another example method, a layer of semiconductor material is formed over a substrate. First and second trenches are etched, where each of the first and second trenches extends through the layer of semiconductor material and into the substrate. A first opening is etched below the first trench, where the first opening adjoins the first trench at a bottom of the first trench and extends laterally below the layer of semiconductor material. A second opening is etched below the second trench, where the second opening adjoins the second trench at a bottom of the second trench and extends laterally below the layer of semiconductor material. A portion of the substrate adjoins the first and second openings. An oxidation process is performed to oxidize the portion of the substrate that adjoins the first and second openings. An insulating material is deposited that fills the openings and the trenches.

An example semiconductor structure having a substrate includes a layer of semiconductor material formed over the substrate. The semiconductor structure includes first and second trenches filled with insulating material, where each of the first and second trenches extends through the layer and into the substrate. The semiconductor structure also includes a first isolation region that adjoins the first trench at a bottom of the first trench. The first isolation region comprises the insulating material and extends laterally below the layer. The semiconductor structure also includes a second isolation region that adjoins the second trench at a bottom of the second trench. The second isolation region comprises the insulating material and extends laterally below the layer. The semiconductor structure further includes an oxidized portion of the substrate that adjoins the first and second isolation regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure having a substrate, the method comprising:
   forming a first layer over the substrate, the first layer comprising semiconductor material;
   etching first and second trenches, each of the first and second trenches extending through the first layer and into the substrate;
   introducing a wet etchant into the trenches, the wet etchant etching a first opening below the first trench and a second opening below the second trench, each of the first and second openings extending laterally below the first layer, the first and second openings being separated by a portion of the substrate adjoining the first and second openings;
   performing a diffusion oxidation process to oxidize the portion of the substrate adjoining the first and second openings;
   depositing an insulating material that fills the openings and the trenches; and
   forming a via that extends through the first layer and into the substrate, the via comprising a conductive material with sidewalls that are coated with an etch stop layer.

2. The method of claim 1, further comprising:
forming one or more transistors between the first trench and the second trench, wherein (i) the oxidized portion of the substrate adjoining the first and second openings, and (ii) the insulating material form an isolation region that electrically isolates the one or more transistors from other structures formed on the substrate.

3. The method of claim 2, wherein the first layer comprises gallium nitride (GaN), the method further comprising:
forming a second layer on the first layer, the second layer comprising aluminum gallium nitride (AlGaN), wherein the one or more transistors comprise a high electron mobility transistor (HEMT) that includes the first layer and the second layer.

4. The method of claim 1, further comprising:
depositing an etch stop layer that coats sidewalls and bottoms of the first and second trenches; and
prior to introducing the wet etchant into the trenches, removing portions of the etch stop layer coating the bottoms of the trenches, wherein the etch stop layer coating the sidewalls prevents the wet etchant from etching portions of the semiconductor structure disposed adjacent to the sidewalls.

5. The method of claim 1, wherein the first layer comprises a first III-V semiconductor material, the method further comprising:
forming a second layer on the first layer, the second layer comprising a second III-V semiconductor material that is different than the first III-V semiconductor material; and
forming a passivation layer on the second layer, wherein each of the first and second trenches extends through the second layer and the passivation layer.

6. The method of claim 5, wherein the first III-V semiconductor material comprises gallium nitride (GaN), and the second III-V semiconductor material comprises aluminum gallium nitride (AlGaN).

7. The method of claim 5, further comprising:
etching a via opening that extends through the first layer, the second layer, and the passivation layer and into the substrate;
depositing the etch stop layer that coats sidewalls and a bottom of the via opening;
removing a portion of the etch stop layer coating the bottom of the via opening; and
forming a contact to the substrate by filling the via opening with the conductive material.

8. The method of claim 1, wherein the performing of the diffusion oxidation process comprises:
introducing a gas into the first and second trenches and the first and second openings to expose the portion to the gas; and
heating the semiconductor structure to a temperature that causes the portion and the gas to react.

9. The method of claim 8, wherein
the portion comprises silicon;
the gas comprises oxygen; and
the reaction of the portion and the gas converts the silicon of the portion to a silicon-oxide material.

10. A method of forming a semiconductor structure having a substrate, the method comprising:
forming a first layer over the substrate, the first layer comprising semiconductor material;
etching first and second trenches, each of the first and second trenches extending through the first layer and into the substrate;

etching a first opening below the first trench, the first opening adjoining the first trench at a bottom of the first trench and extending laterally below the first layer;
etching a second opening below the second trench, the second opening adjoining the second trench at a bottom of the second trench and extending laterally below the first layer, wherein the first and second opening are separated by a portion of the substrate that adjoins the first and second openings;
performing a diffusion oxidation process to oxidize the portion of the substrate that adjoins the first and second openings;
depositing an insulating material that fills the openings and the trenches; and
forming a via that extends through the first layer and into the substrate, the via comprising a conductive material with sidewalls that are coated with an etch stop layer.

11. The method of claim 10, further comprising:
forming one or more transistors between the first trench and the second trench, wherein (i) the oxidized portion of the substrate, and (ii) the insulating material form a channel that electrically isolates the one or more transistors from other structures formed on the substrate.

12. The method of claim 10, wherein the performing of the diffusion oxidation process comprises:
introducing a gas into the first and second trenches and the first and second openings to expose the portion to the gas; and
heating the semiconductor structure to a temperature that causes the portion and the gas to react.

13. The method of claim 12, wherein
the portion comprises silicon;
the gas comprises oxygen; and
the reaction of the portion and the gas converts the silicon of the portion to a silicon-oxide material.

14. A semiconductor structure having a substrate, the semiconductor structure comprising:
a first layer of semiconductor material formed over the substrate;
first and second trenches filled with insulating material, each of the first and second trenches extending through the first layer and into the substrate;
a first isolation region that adjoins the first trench at a bottom of the first trench, the first isolation region comprising the insulating material and extending laterally below the first layer;
a second isolation region that adjoins the second trench at a bottom of the second trench, the second isolation region comprising the insulating material and extending laterally below the first layer;
an oxidized portion of the substrate that separates and adjoins the first and second isolation regions;
a via that extends through the first layer and into the substrate, the via comprising a conductive material with sidewalls that are coated with an etch stop layer; and
a transistor including a source region, a drain region, and a gate structure formed between the first trench and the second trench, the gate structure being disposed on a polarization modulation layer and between the source and drain regions.

15. The semiconductor structure of claim 14, wherein (i) the oxidized portion of the substrate, (ii) the first and second trenches, and (iii) the first and second isolation regions form a channel that electrically isolates the transistor from other structures formed on the substrate.

16. The semiconductor structure of claim 15, wherein the first layer comprises gallium nitride (GaN), the semiconductor structure further comprising:
- a second layer comprising aluminum gallium nitride (AlGaN) that is formed on the first layer, wherein the transistor comprises a high electron mobility transistor (HEMT) that includes the first layer and the second layer.

17. The semiconductor structure of claim 14, further comprising:
- an etch stop layer that coats sidewalls of the first and second trenches.

18. The semiconductor structure of claim 14, wherein the first layer comprises a first III-V semiconductor material, the structure further comprising:
- a second layer formed on the first layer, the second layer comprising a second III-V semiconductor material that is different than the first III-V semiconductor material; and
- a passivation layer formed on the second layer, wherein each of the first and second trenches extends through the second layer and the passivation layer.

19. The semiconductor structure of claim 18, wherein the first III-V semiconductor material comprises gallium nitride (GaN), and the second III-V semiconductor material comprises aluminum gallium nitride (AlGaN).

20. The semiconductor structure of claim 18, wherein the via is a contact to the substrate that extends through the first layer, the second layer, and the passivation layer and into the substrate.

* * * * *